(12) United States Patent
Nagawa

(10) Patent No.: US 11,265,503 B2
(45) Date of Patent: Mar. 1, 2022

(54) ANALOG TO DIGITAL CONVERTER, SOLID-STATE IMAGING ELEMENT, AND CONTROL METHOD OF ANALOG TO DIGITAL CONVERTER

(71) Applicant: Sony Semiconductor Solutions Corporation, Kanagawa (JP)

(72) Inventor: Yoshihito Nagawa, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 11 days.

(21) Appl. No.: 16/630,756

(22) PCT Filed: Jun. 4, 2018

(86) PCT No.: PCT/JP2018/021310
§ 371 (c)(1),
(2) Date: Jan. 13, 2020

(87) PCT Pub. No.: WO2019/017092
PCT Pub. Date: Jan. 24, 2019

(65) Prior Publication Data
US 2020/0186734 A1    Jun. 11, 2020

(30) Foreign Application Priority Data

Jul. 20, 2017 (JP) .............................. JP2017-140574

(51) Int. Cl.
*H04N 5/378* (2011.01)
*H03F 3/45* (2006.01)
(Continued)

(52) U.S. Cl.
CPC ......... *H04N 5/378* (2013.01); *H03F 3/45273* (2013.01); *H03M 1/08* (2013.01); *H04N 5/357* (2013.01); *H04N 5/374* (2013.01)

(58) Field of Classification Search
CPC ........ H04N 5/378; H04N 5/357; H04N 5/374; H03F 3/45273; H03M 1/08
See application file for complete search history.

(56) References Cited

U.S. PATENT DOCUMENTS

2009/0009619 A1    1/2009  Takeda
2009/0153241 A1    6/2009  Trifonov
(Continued)

FOREIGN PATENT DOCUMENTS

CN    101320974 A    12/2008
CN    101447780 A    6/2009
(Continued)

OTHER PUBLICATIONS

Extended European Search Report dated May 28, 2020 for corresponding European Application No. 18835008.6.

*Primary Examiner* — Twyler L Haskins
*Assistant Examiner* — Fayez A Bhuiyan
(74) *Attorney, Agent, or Firm* — Michael Best & Friedrich LLP

(57) ABSTRACT

A differential amplifier circuit amplifies a difference between an input analog signal and a ramp signal which changes over time and outputs a difference signal. An amplifying element amplifies the difference signal and outputs the same as an amplified signal. A time measuring unit measures a length of a conversion period until a level of the analog signal substantially coincides with a level of the ramp signal on the basis of a level of the amplified signal and outputs the same as a digital signal obtained by converting the analog signal. One end of a capacitor is connected to one of an input terminal and a predetermined connection terminal of the amplifying element. A switch connects the other end of the capacitor to the other of the input terminal or the (Continued)

predetermined connection terminal in the conversion period, and disconnects the other end outside the conversion period.

20 Claims, 23 Drawing Sheets

(51) Int. Cl.
*H03M 1/08* (2006.01)
*H04N 5/357* (2011.01)
*H04N 5/374* (2011.01)

(56) References Cited

U.S. PATENT DOCUMENTS

| | | | |
|---|---|---|---|
| 2010/0091167 A1 | 4/2010 | Azami | |
| 2010/0315540 A1 | 12/2010 | Hoshino | |
| 2011/0074612 A1 | 3/2011 | Ariyoshi | |
| 2011/0309235 A1* | 12/2011 | Yoshida | H03M 1/1023 |
| | | | 250/208.1 |
| 2016/0014365 A1* | 1/2016 | Mizuguchi | H04N 5/3745 |
| | | | 348/308 |

FOREIGN PATENT DOCUMENTS

| | | |
|---|---|---|
| CN | 102065249 A | 5/2011 |
| CN | 104025568 A | 9/2014 |
| JP | 2010-093641 A | 4/2010 |
| JP | 2013-172270 A | 9/2013 |
| JP | 2015-177421 A | 10/2015 |

* cited by examiner a b a b a b

ANALOG TO DIGITAL CONVERTER, SOLID-STATE IMAGING ELEMENT, AND CONTROL METHOD OF ANALOG TO DIGITAL CONVERTER

TECHNICAL FIELD

The present technology relates to an analog to digital converter, a solid-state imaging element, and a control method of the analog to digital converter. Specifically, the present technology relates to an analog to digital converter which converts by a comparator and a counter, a solid-state imaging element, and a control method of the analog to digital converter.

BACKGROUND ART

Conventionally, an analog to digital converter (ADC) is used for converting an analog signal to a digital signal in various circuits such as a solid-state imaging element and a ranging sensor. In particular, in the solid-state imaging element, an ADC referred to as an inclined type is often used because of a small-scale circuit. The inclined ADC is provided with a comparator which compares an analog signal to be converted with a ramp signal, and a counter which performs counting within a conversion period in which an output of the comparator is at a predetermined level. In order to improve a characteristic of the inclined type, an ADC is proposed in which an amplifier circuit to which an amplification transistor and a capacitor are connected in parallel is arranged in a comparator (refer to, for example, Patent Document 1). By connecting the capacitor and the amplification transistor in parallel, capacitance of the amplifier circuit as seen from an input side may be made larger than capacitance of the capacitor. This effect is referred to as a mirror effect.

CITATION LIST

Patent Document

Patent Document 1: Japanese Patent Application Laid-Open No. 2010-93641

SUMMARY OF THE INVENTION

Problems to be Solved by the Invention

In the above-described conventional technology, the capacitance as seen from the input side increases due to the mirror effect, so that noise generated in the ADC in the conversion period may be reduced by the capacitor having small capacitance. However, in a case of operating a plurality of ADCs, there is a possibility that the noise generated in a period other than the conversion period in a certain ADC is propagated to another ADC via a power supply system or a ground system. Furthermore, the longer the ADC operating time, the longer the capacitor charge/discharge time, and the higher the probability that the capacitor fails. In this manner, there is a problem that the reliability of the ADC is lowered due to the noise or capacitor failure.

The present technology is achieved in view of such a situation, and an object thereof is to improve the reliability in the analog to digital converter provided with the capacitor.

Solutions to Problems

The present technology is achieved for solving the above-described problem, and a first aspect thereof is an analog to digital converter including a differential amplifier circuit configured to amplify a difference between an input analog signal and a ramp signal which changes over time to output as a difference signal, an amplifying element configured to amplify the difference signal to output as an amplified signal, a time measuring unit configured to measure a length of a conversion period until a level of the analog signal substantially coincides with a level of the ramp signal on the basis of a level of the amplified signal to output as a digital signal obtained by converting the analog signal, a capacitor having one end connected to one of an input terminal or a predetermined connection terminal of the amplifying element, and a switch configured to connect the other end of the capacitor to the other of the input terminal or the predetermined connection terminal in the conversion period and disconnect the other end from the other in a period other than the conversion period; and a control method thereof. This brings an effect that the capacitor is disconnected in the period other than the conversion period.

Furthermore, in the first aspect, the predetermined connection terminal may be an output terminal of the amplifying terminal. This brings an effect that the capacitor is disconnected from the input terminal or output terminal of the amplifying terminal.

Furthermore, in the first aspect, the predetermined connection terminal may be a terminal of a power supply potential. This brings an effect that the capacitor is disconnected from the output terminal of the amplifying element or the terminal of the power supply potential.

Furthermore, in the first aspect, the predetermined connection terminal may be a terminal of a predetermined reference potential lower than the power supply potential. This brings an effect that the capacitor is disconnected from the output terminal of the amplifying element or the terminal of the reference potential.

Furthermore, in the first aspect, the one end may be connected to the input terminal, and the switch may connect the other end to the predetermined connection terminal in a case where the level of the amplified signal is the predetermined level. This brings an effect that the other end of the capacitor is disconnected from the connection terminal.

Furthermore, in the first aspect, the one end may be connected to the predetermined terminal, and the switch may connect the other end to the input terminal in a case where the level of the amplified signal is the predetermined level. This brings an effect that the other end of the capacitor is disconnected from the input terminal of the amplifying element.

Furthermore, in the first aspect, the capacitor may be a MOS capacitor. This brings an effect that the MOS capacitor is disconnected in a period other than the conversion period.

Furthermore, in the first aspect, the differential amplifier circuit may include a pair of N-type MOS transistors which output a signal corresponding to the difference. This brings an effect that a difference signal is output by the differential amplifier circuit in which the pair of N-type MOS transistors receive the signal.

Furthermore, in the first aspect, the differential amplifier circuit may include a pair of P-type MOS transistors which output a signal corresponding to the difference. This brings an effect that a difference signal is output by the differential amplifier circuit in which the pair of P-type MOS transistors receive the signal.

Furthermore, a second aspect of the present technology is a solid-state imaging element including an analog to digital converter including a differential amplifier circuit configured to amplify a difference between an input analog signal and a ramp signal which changes over time to output as a difference signal, an amplifying element configured to amplify the difference signal to output as an amplified signal, a time measuring unit configured to measure a length of a conversion period until a level of the analog signal substantially coincides with a level of the ramp signal on the basis of a level of the amplified signal to output as a digital signal obtained by converting the analog signal, a capacitor having one end connected to one of an input terminal or a predetermined connection terminal of the amplifying element, and a switch configured to connect the other end of the capacitor to the other of the input terminal or the predetermined connection terminal in the conversion period and disconnect the other end from the other in a period other than the conversion period, and a pixel array unit in which pixels configured to generate the analog signal to input to the analog to digital converter are arranged. This brings an effect that the analog signal from the pixel array unit is converted into the digital signal in the conversion period, and the capacitor is disconnected in the period other than the conversion period.

Furthermore, in the second aspect, in the solid-state imaging element, the pixel array unit may be arranged on a first semiconductor chip, and the analog to digital converter may be arranged on a second semiconductor chip layered on the first substrate. This brings an effect that the capacitor is disconnected in the circuit arranged on the layered first and second semiconductor chips.

Effects of the Invention

According to the present technology, in the analog to digital converter in which the noise is reduced by the capacitor, an excellent effect that the reliability may be improved may be achieved. Note that, the effects are not necessarily limited to the effects herein described and may include any of the effects described in the present disclosure.

MODE FOR CARRYING OUT THE INVENTION

Modes for carrying out the present technology (hereinafter, referred to as embodiments) are hereinafter described. The description is given in the following order.

1. First Embodiment (Example of Disconnecting Capacitor in Period Other Than Conversion Period)
2. Second Embodiment (Example in Which Circuit in Layered Solid-State Imaging Element Disconnects Capacitor in Period Other Than Conversion Period)
3. Application Example to Mobile Body 1. First Embodiment

[Configuration Example of Imaging Device]

Figure 1:
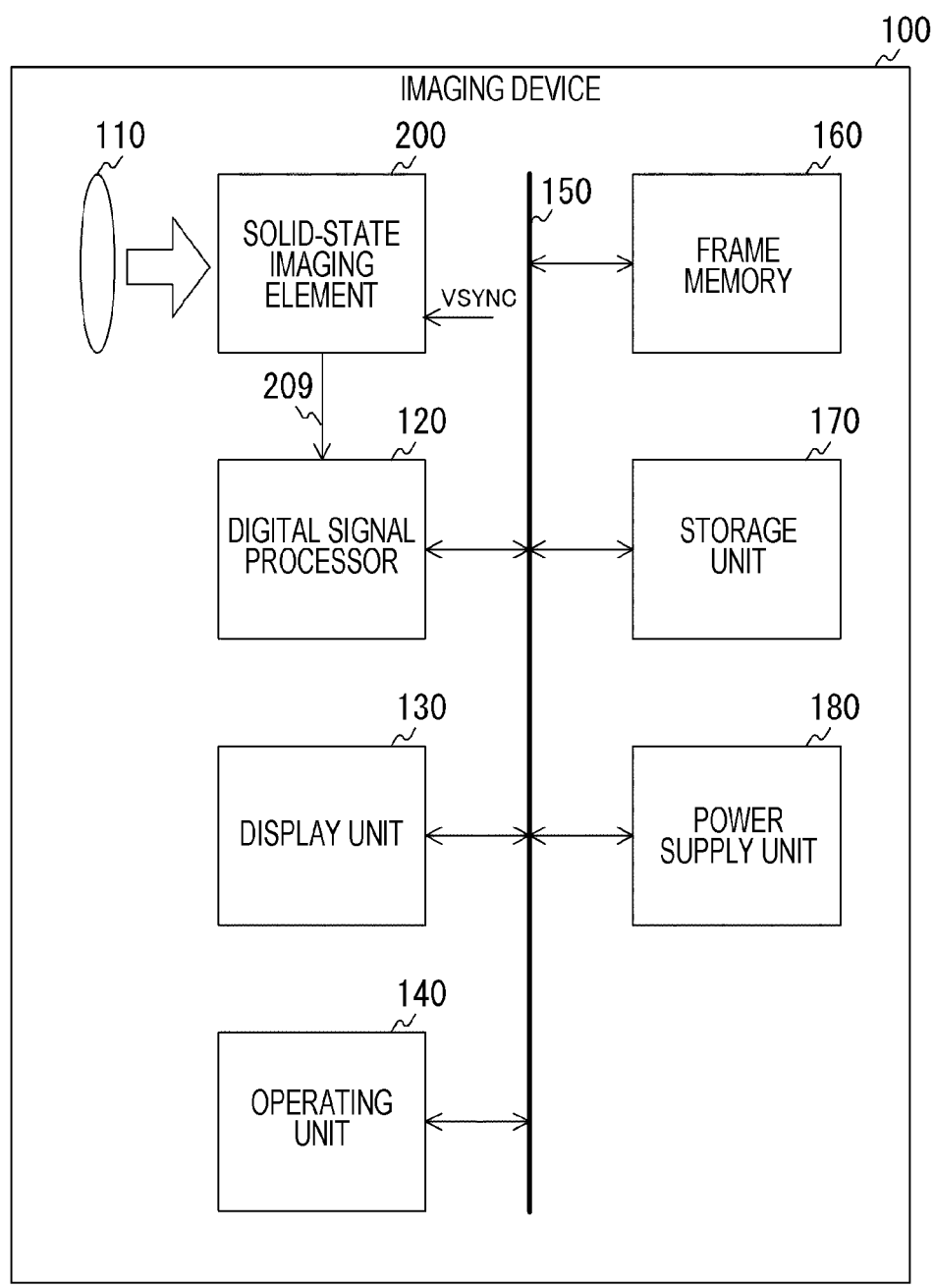
FIG. 1 is a block diagram illustrating a configuration example of an imaging device in a first embodiment of the present technology.

FIG. 1 is a block diagram illustrating a configuration example of an imaging device 100 in a first embodiment of the present technology. The imaging device 100 is a device for imaging image data and is provided with an optical unit 110, a solid-state imaging element 200, and a digital signal processor 120. The imaging device 100 is further provided with a display unit 130, an operating unit 140, a bus 150, a frame memory 160, a storage unit 170, and a power supply unit 180. As the imaging device 100, for example, in addition to a digital camera such as a digital still camera, a smartphone and a personal computer having an imaging function, an in-vehicle camera and the like are assumed.

The optical unit 110 condenses light from a subject and guides the same to the solid-state imaging element 200. The solid-state imaging element 200 generates the image data by photoelectric conversion in synchronization with a vertical synchronization signal VSYNC. Herein, the vertical synchronization signal VSYNC is a periodic signal having a predetermined frequency (for example, 30 Hz) indicating an imaging timing. The solid-state imaging element 200 supplies the generated image data to the digital signal processor 120 via a signal line 209.

The digital signal processor 120 executes predetermined signal processing such as demosaic processing and noise reduction processing on the image data from the solid-state imaging element 200. The digital signal processor 120 outputs the processed image data to the frame memory 160 and the like via the bus 150.

The display unit 130 displays the image data. As the display unit 130, for example, a liquid crystal panel or an organic electro luminescence (EL) panel is assumed. The operating unit 140 generates an operation signal in accordance with a user operation.

The bus 150 is a common path for the optical unit 110, the solid-state imaging element 200, the digital signal processor 120, the display unit 130, the operating unit 140, the frame memory 160, the storage unit 170, and the power supply unit 180 to exchange data with one another.

The frame memory 160 holds the image data. The storage unit 170 stores various data such as the image data. The power supply unit 180 supplies power to the solid-state imaging element 200, the digital signal processor 120, the display unit 130 and the like.

[Configuration Example of Solid-state Imaging Element]

Figure 2:
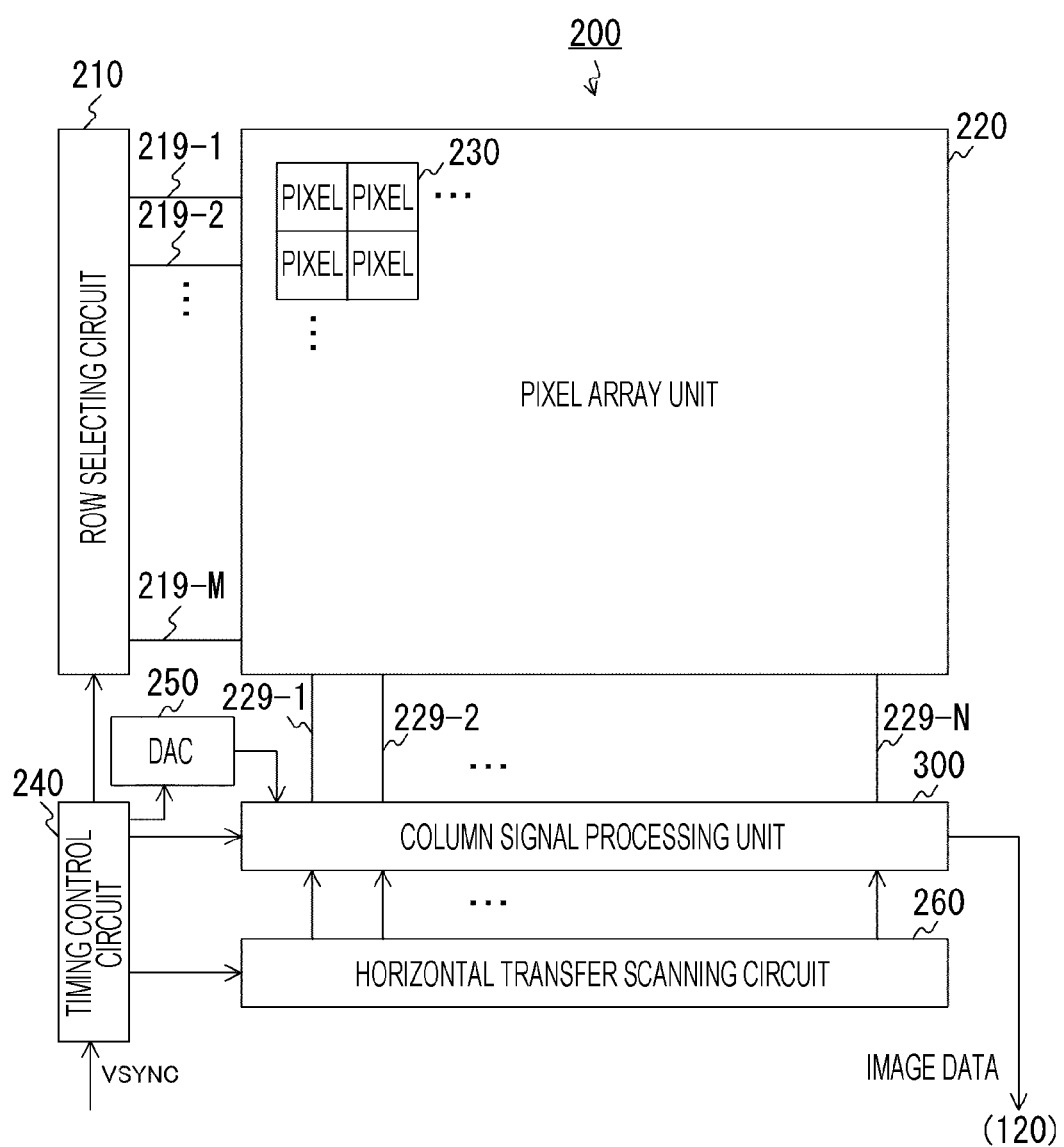
FIG. 2 is a block diagram illustrating a configuration example of a solid-state imaging element in the first embodiment of the present technology.

FIG. 2 is a block diagram illustrating a configuration example of the solid-state imaging element 200 in the first embodiment of the present technology. The solid-state imaging element 200 is provided with a row selecting circuit 210, a pixel array unit 220, a timing control circuit 240, a digital-to-analog converter (DAC) 250, a column signal processing unit 300, and a horizontal transfer scanning circuit 260. In the pixel array unit 220, a plurality of pixels 230 is arranged in a two-dimensional lattice manner. The circuits are provided on a single semiconductor chip.

Hereinafter, a set of pixels 230 arranged in a predetermined direction (such as horizontal direction) is referred to as a "row", and a set of pixels 230 arranged in a direction perpendicular to the row is referred to as a "column". The number of rows and columns of the pixel array unit 220 are set to M and N (M and N are integers), respectively.

The row selecting circuit 210 sequentially selects the rows to drive in synchronization with a horizontal synchronization signal having a frequency higher than that of the vertical synchronization signal VSYNC. A horizontal signal line 219-$m$ is wired to an m-th row (m is an integer from 1 to M). Each of the horizontal signal lines 219-$m$ includes a plurality of signal lines such as a signal line for transferring a reset signal and a signal line for transferring a selection signal.

The pixel 230 converts incident light into an analog electric signal by photoelectric conversion. The pixel 230 in an n-th column (n is an integer from 1 to N) outputs an electrical signal as a pixel signal to the column signal processing unit 300 via a vertical signal line 229-$n$.

The DAC 250 generates a ramp signal which changes over time by digital-to-analog (DA) conversion on a digital signal from the timing control circuit 240. The DAC 250 supplies the ramp signal to the column signal processing unit 300.

The timing control circuit 240 controls operation timings of the row selecting circuit 210, the DAC 250, the column signal processing unit 300, and the horizontal transfer scanning circuit 260 in synchronization with the vertical synchronization signal VSYNC.

The column signal processing unit 300 executes predetermined signal processing on the pixel signals for every column. This signal processing includes analog-to-digital (AD) conversion processing of converting the pixel signal into the digital signal. The column signal processing unit 300 outputs the digital signal after the signal processing to the digital signal processor 120 in accordance with control of the horizontal transfer scanning circuit 260. The image data is generated by M×N digital signals.

The horizontal transfer scanning circuit 260 controls the column signal processing unit 300 to sequentially output the digital signals.

[Configuration Example of Pixel]

Figure 3:
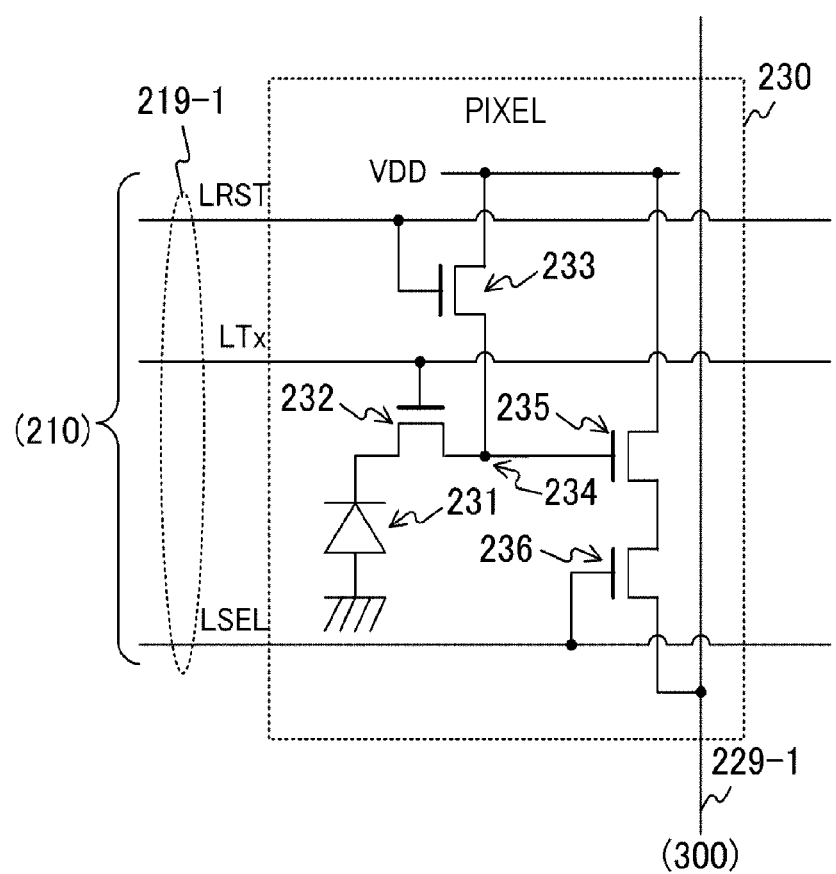
FIG. 3 is a circuit diagram illustrating a configuration example of a pixel in the first embodiment of the present technology.

FIG. 3 is a circuit diagram illustrating a configuration example of the pixel 230 in the first embodiment of the present technology. The pixel 230 is provided with a photodiode 231, a transfer transistor 232, a reset transistor 233, a floating diffusion layer 234, an amplification transistor 235, and a selection transistor 236.

The photodiode 231 generates a charge by photoelectrically converting the incident light. The transfer transistor 232 transfers the charge from the photodiode 231 to the floating diffusion layer 234 in accordance with a transfer signal LTx from the row selecting circuit 210. The reset transistor 233 extracts the charge from the floating diffusion layer 234 to initialize in accordance with a reset signal LRST from the row selecting circuit 210.

The floating diffusion layer 234 accumulates the transferred charge and generates a voltage corresponding to an accumulated charge amount. The amplification transistor 235 amplifies a signal of the voltage of the floating diffusion layer 234. The selection transistor 236 outputs the amplified signal as the pixel signal to the vertical signal line 229-$m$ in accordance with a selection signal LSEL from the row selecting circuit 210.

[Configuration Example of Column Signal Processing Unit]

Figure 4:
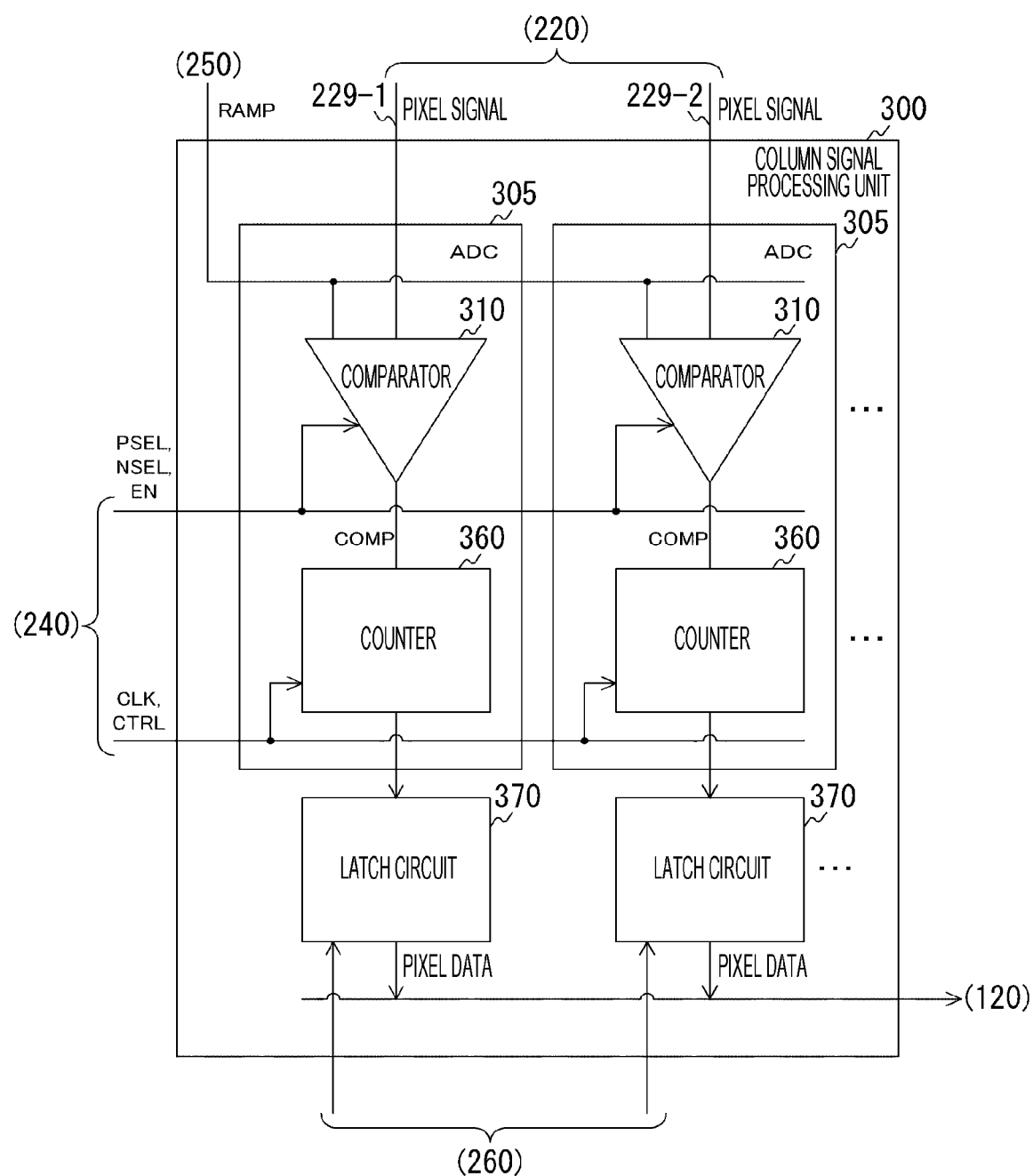
FIG. 4 is a block diagram illustrating a configuration example of a column signal processing unit in the first embodiment of the present technology.

FIG. 4 is a block diagram illustrating a configuration example of the column signal processing unit 300 in the first embodiment of the present technology. The column signal processing unit 300 is provided with an ADC 305 and a latch circuit 370 for every column. In a case where the number of columns is N, N ADCs 305 and N latch circuits 370 are provided. The pixel signals from the corresponding n-th column are input to the n-th ADC 305 (n is an integer from 1 to N). Furthermore, the ramp signal RAMP from the DAC 250 is input to all the ADCs 305.

The ADC 305 converts an analog pixel signal into a digital signal. The ADC 305 is provided with a comparator 310 and a counter 360. The comparator 310 compares the pixel signal with the ramp signal RAMP. The comparator 310 outputs an output signal COMP indicating a comparison result to the counter 360.

The counter 360 counts a count value in synchronization with a clock signal CLK in a conversion period in which the output signal COMP is at a predetermined level. In other words, the counter 360 measures a length of the conversion period. Note that, the counter 360 is an example of a time measuring unit recited in claims.

Furthermore, the clock signal and a control signal CTRL from the timing control circuit 240 are input to the counter 360. The control signal CTRL is a signal for indicating up-counting or down-counting. The counter 360 counts in synchronization with the clock signal CLK and outputs a signal indicating a count value (time measured value) as digital pixel data obtained by converting the analog pixel signal.

The latch circuit 370 holds the pixel data output from the corresponding ADC 305 and outputs the pixel data in accordance with the control of the horizontal transfer scanning circuit 260.

[Configuration Example of Comparator]

Figure 5:
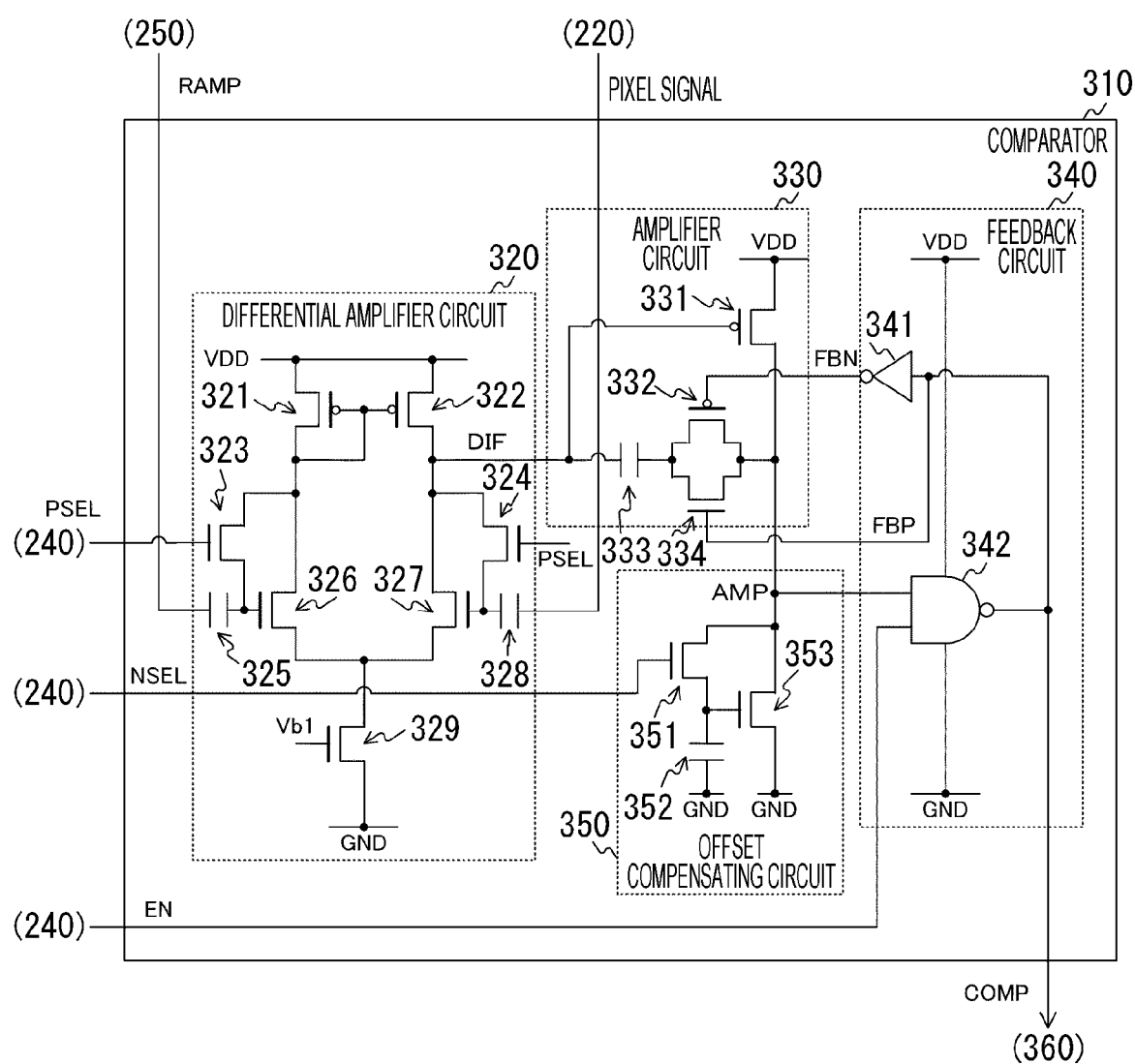
FIG. 5 is a circuit diagram illustrating a configuration example of a comparator in the first embodiment of the present technology.

FIG. 5 is a circuit diagram illustrating a configuration example of the comparator 310 in the first embodiment of the present technology. The comparator 310 is provided with a differential amplifier circuit 320, an amplifier circuit 330, an offset compensating circuit 350, and a feedback circuit 340.

The differential amplifier circuit 320 is provided with p-type metal-oxide-semiconductor (pMOS) transistors 321 and 322 and capacitors 325 and 328. Furthermore, the differential amplifier circuit 320 is provided with n-type metal-oxide-semiconductor (nMOS) transistors 323, 324, 326, 327, and 329.

The pMOS transistor 321 and the nMOS transistor 326 are connected in series to a power supply potential VDD, and the pMOS transistor 322 and the nMOS transistor 327 are also connected in series to a terminal of the power supply potential VDD. Furthermore, a gate of the pMOS transistor 321 is connected to a source of the pMOS transistor 321 and a gate of the pMOS transistor 322.

The pMOS transistors 321 and 322 serve as a current mirror circuit. A source of the pMOS transistor 322 is also connected to the amplifier circuit 330.

Drains of the nMOS transistors 326 and 327 are connected in common to a source of the nMOS transistor 329. A gate of the nMOS transistor 326 is connected to one end of the capacitor 325, and a gate of the nMOS transistor 327 is connected to one end of the capacitor 328. The nMOS transistors 326 and 327 serve as a so-called n receiving differential pair.

A constant bias voltage Vb1 is applied to a gate of the nMOS transistor 329, and a drain thereof is connected to a terminal of a predetermined reference potential (for example, ground potential GND) lower than the power supply potential VDD.

Furthermore, a source and a drain of the nMOS transistor 323 are connected to the source of the pMOS transistor 321 and the one end of the capacitor 325. The ramp signal RAMP is input to the other end of the capacitor 325. An auto-zero signal PSEL from the timing control circuit 240 is input to a gate of the nMOS transistor 323.

Furthermore, a source and a drain of the nMOS transistor 324 are connected to the source of the pMOS transistor 322 and the one end of the capacitor 328. The pixel signal from the pixel array unit 220 is input to the other end of the capacitor 328. The auto-zero signal PSEL from the timing control circuit 240 is input to a gate of the nMOS transistor 324.

With the above-described configuration, the differential amplifier circuit 320 amplifies a difference between the ramp signal RAMP and the pixel signal and outputs the same as a difference signal DIF to the amplifier circuit 330. The difference signal DIF is at a high level in a case where a level of the ramp signal RAMP is higher than that of the pixel signal. Furthermore, according to the auto-zero signal PSEL, the differential amplifier circuit 320 removes an offset in the differential amplifier circuit 320. A function of removing (compensating for) the offset in this manner is referred to as an auto-zero function.

The amplifier circuit 330 is provided with pMOS transistors 331 and 332, an nMOS transistor 334, and a capacitor 333. As the capacitor 333, an aluminum electrolytic capacitor, a layered ceramic capacitor, a tantalum capacitor and the like are used.

The difference signal DIF from the differential amplifier circuit 320 is input to a gate of the pMOS transistor 331. A drain of the pMOS transistor 331 is connected to the power supply, and a source thereof is connected to the offset compensating circuit 350 and the feedback circuit 340.

Furthermore, one end of the capacitor 333 is connected to the gate of the pMOS transistor 331. The pMOS transistor 332 and the nMOS transistor 334 are connected in parallel between the other end of the capacitor 333 and the source of the pMOS transistor 331. A feedback signal FBN from the feedback circuit 340 is input to a gate of the pMOS transistor 332, and a feedback signal FBP from the feedback circuit 340 is input to a gate of the nMOS transistor 334. Here, the feedback signal FBN is a signal obtained by inverting the feedback signal FBP.

With the configuration described above, the pMOS transistor 331 inverts and amplifies the difference signal DIF and outputs the same as an amplified signal AMP. Note that, although the difference signal DIF is inverted and amplified by the pMOS transistor 331, it is also possible to provide the nMOS transistor in place of the pMOS transistor 331 to amplify without inverting.

Note that, the pMOS transistor 331 is an example of an amplifying element recited in claims. Furthermore, the gate of the pMOS transistor 331 is an example of an input terminal recited in claims, and the source thereof is an example of an output terminal recited in claims.

Furthermore, the pMOS transistor 332 and the nMOS transistor 334 operate as a switch which connects the one end of the capacitor 333 to the source of the pMOS transistor 331 in accordance with the feedback signals FBP and FBN. In a case where the capacitor 333 is connected by this switch, capacitance of the amplifier circuit 330 as seen from an input side is larger than capacitance of the capacitor 333. A reason for which the capacitance increases is to be described later.

The offset compensating circuit 350 is provided with nMOS transistors 351 and 353 and a capacitor 352. An auto-zero signal NSEL from the timing control circuit 240 is input to a gate of the nMOS transistor 351. A level complementary to that of the auto-zero signal PSEL is set as a level of the auto-zero signal NSEL. The amplified signal AMP is input to a source of the nMOS transistor 351, and a drain thereof is connected to one end of the capacitor 352. The other end of the capacitor 352 is connected to a terminal of the reference potential (such as the ground potential GND).

Furthermore, a source of the nMOS transistor 353 is connected to the amplifier circuit 330, and a drain thereof is connected to the terminal of the reference potential (such as the ground potential GND). A gate of the nMOS transistor 353 is connected to the one end of the capacitor 352.

With the configuration described above, the offset compensating circuit 350 removes (compensates for) an offset generated in the amplifier circuit 330 in accordance with the auto-zero signal NSEL.

Furthermore, the feedback circuit 340 is provided with an inverter 341 and a negative AND (NAND) gate 342.

The NAND gate 342 obtains an AND of the amplified signal AMP from the amplifier circuit 330 and an enable signal EN from the timing control circuit 240. The NAND gate 342 outputs a signal of the AND as the output signal COMP to the counter 360 and feeds the same back as the feedback signal FBP to the inverter 341 and the amplifier circuit 330.

Here, the enable signal EN is a signal indicating whether or not to enable a comparing function of the comparator 310. For example, the enable signal EN is set to a high level in a case of enabling, and the enable signal EN is set to a low level in a case of disabling.

The inverter 341 inverts the feedback signal FBP and outputs the same as the feedback signal FBN to the amplifier circuit 330.

With the configuration described above, the feedback circuit 340 feeds back a signal obtained by inverting the amplified signal AMP as the feedback signal FBP in a case where the enable signal EN is at the high level (enable). On the other hand, in a case where the enable signal EN is at the low level (disable), the feedback circuit 340 feeds back a signal fixed at a high level as the feedback signal FBP regardless of the level of the amplified signal AMP.

Figure 6:
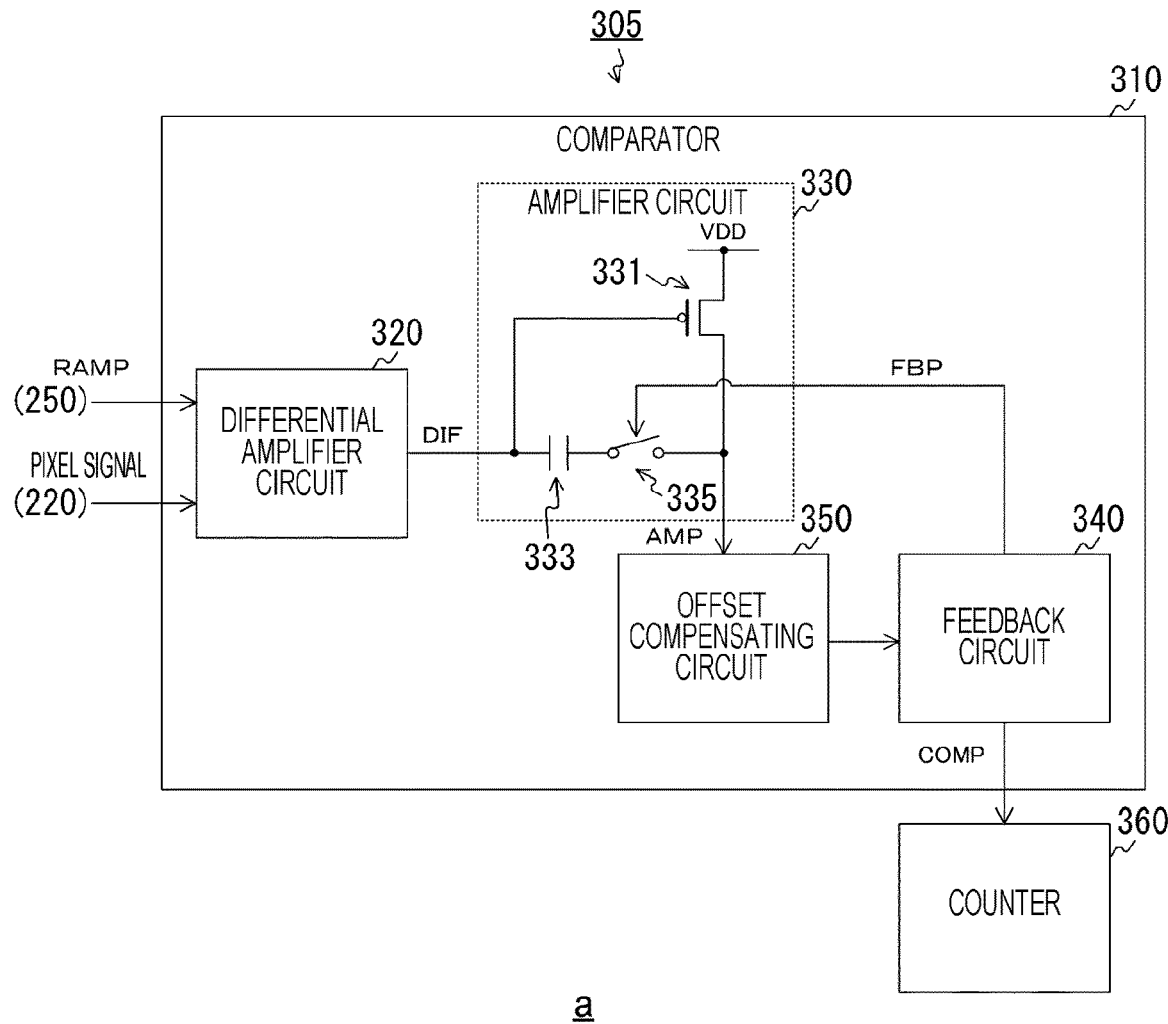
FIG. 6 is a simplified diagram of the comparator and an amplifier circuit in the first embodiment of the present technology.
Figure 6:
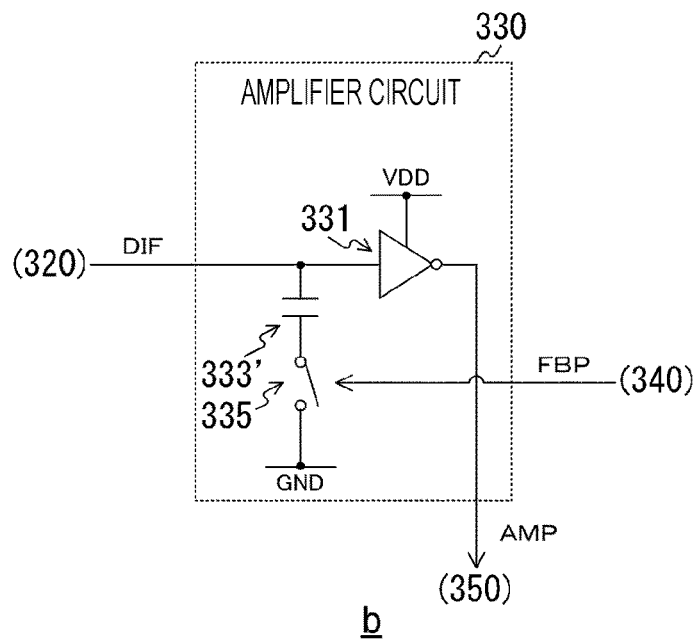

FIG. 6 is a simplified diagram of the comparator 310 and the amplifier circuit 330 in the first embodiment of the present technology. In the drawing, a is a simplified block diagram of the comparator 310, and b is a simplified circuit diagram of the amplifier circuit 330. As illustrated in a in the drawing, the pMOS transistor 332 and the nMOS transistor 334 may be replaced with a switch 335 which opens and closes in accordance with the feedback signal FBP. Furthermore, the pMOS transistor 331 may be replaced with an inverter which inverts and amplifies the difference signal DIF as illustrated in b in the drawing.

With reference to a in FIG. 6, an output voltage $V_{out}$ of the amplifier circuit 330 (that is, a voltage of the amplified signal AMP) may be expressed by the following expression.

$$V_{out} = -Av \times V_{in} \qquad \text{expression 1}$$

In the expression described above, Av represents a gain of the pMOS transistor 331. $V_{in}$ represents an input voltage of the amplifier circuit 330 (that is, a voltage of the difference signal DIF). The unit of the input voltage $V_{in}$ and the output voltage $V_{out}$ is, for example, volt (V).

Furthermore, the input voltage $V_{in}$ is expressed by the following expression.

[Math. 1]

$$V_{in} = \frac{1}{C} \int I_{in} dt + V_{out} \qquad \text{expression 2}$$

In the expression described above, $I_{in}$ represents an input current input to the amplifier circuit 330. The unit of the input current $I_{in}$ is, for example, ampere. t represents time and the unit of which is, for example, second (s). C represents the capacitance of the capacitor 333 and the unit of which is, for example, farad (F).

When Laplace transform is performed on expressions 1 and 2, the following expressions are obtained.

$$V_{out}(s) = -Av \times V_{in}(s) \qquad \text{expression 3}$$

$$V_{in}(s) = I_{in}(s)/(sC) + V_{out}(s) \qquad \text{expression 4}$$

In the expressions described above, s represents a complex number.

When $V_{out}(s)$ is deleted from expressions 3 and 4, the following expression is obtained.

$$V_{in}(s) = I_{in}(s)/sC - Av \times V_{in}(s) \qquad \text{expression 5}$$

When expression 5 is transformed, the following expression is obtained.

$$V_{in}(s)/I_{in}(s) = 1/\{sC \times (1+Av)\} \qquad \text{expression 6}$$

From expression 6, the capacitance of the amplifier circuit 330 as seen from the input side is (1+Av) times the capacitance C of the capacitor 333. An effect that the capacitance as seen from the input side increases due to parallel connection of the capacitor 333 in this manner is referred to as a mirror effect, and the capacitance of C×(1+Av) is referred to as mirror capacitance. A capacitor 333' in b in FIG. 6 represents the mirror capacitance. The mirror capacitance and resistance of a circuit or wiring connected to the mirror capacitance form a low-pass filter. With this low-pass filter, noise in a high-frequency band higher than a cutoff frequency may be reduced in the conversion period. Then, since the capacitance increases due to the mirror effect, the high-frequency band to be cut off may be widened by small capacitance C. In other words, the frequency band to be passed may be narrowed by the small capacitance C.

Figure 7:
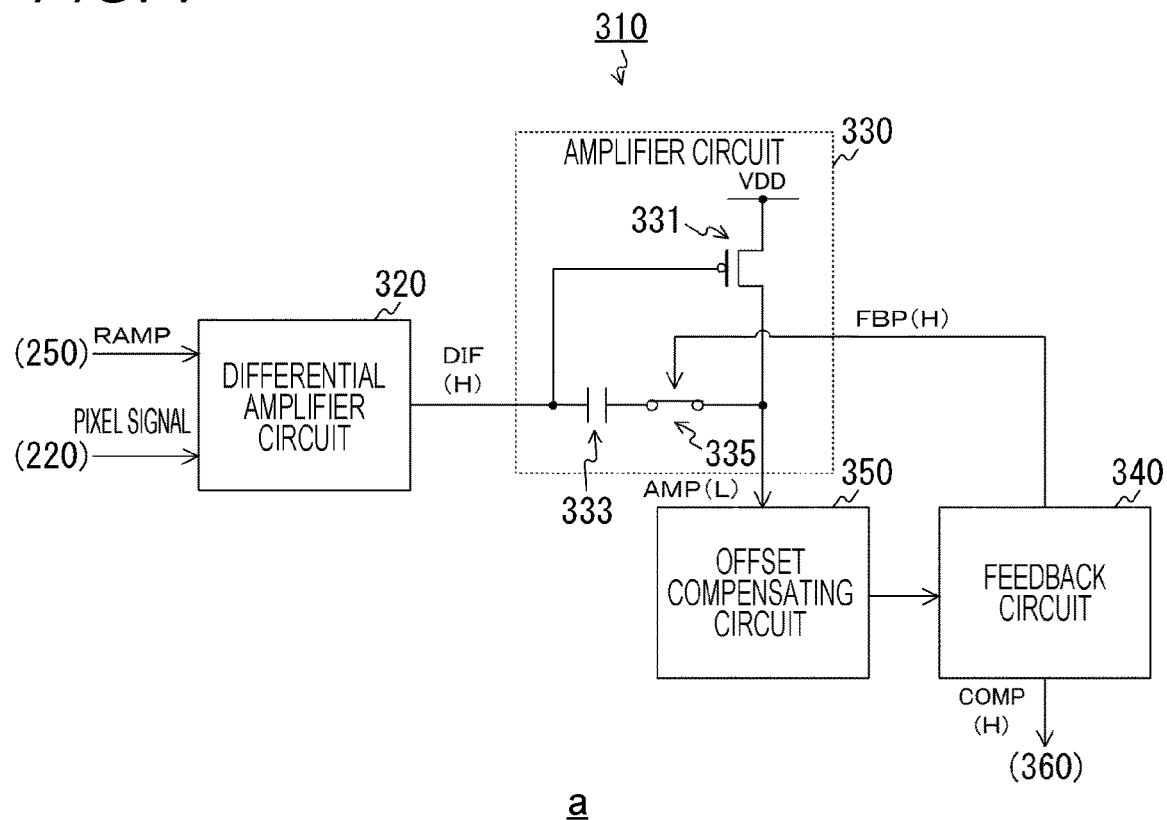
FIG. 7 is a view for explaining an operation of the comparator in the first embodiment of the present technology.
Figure 7:
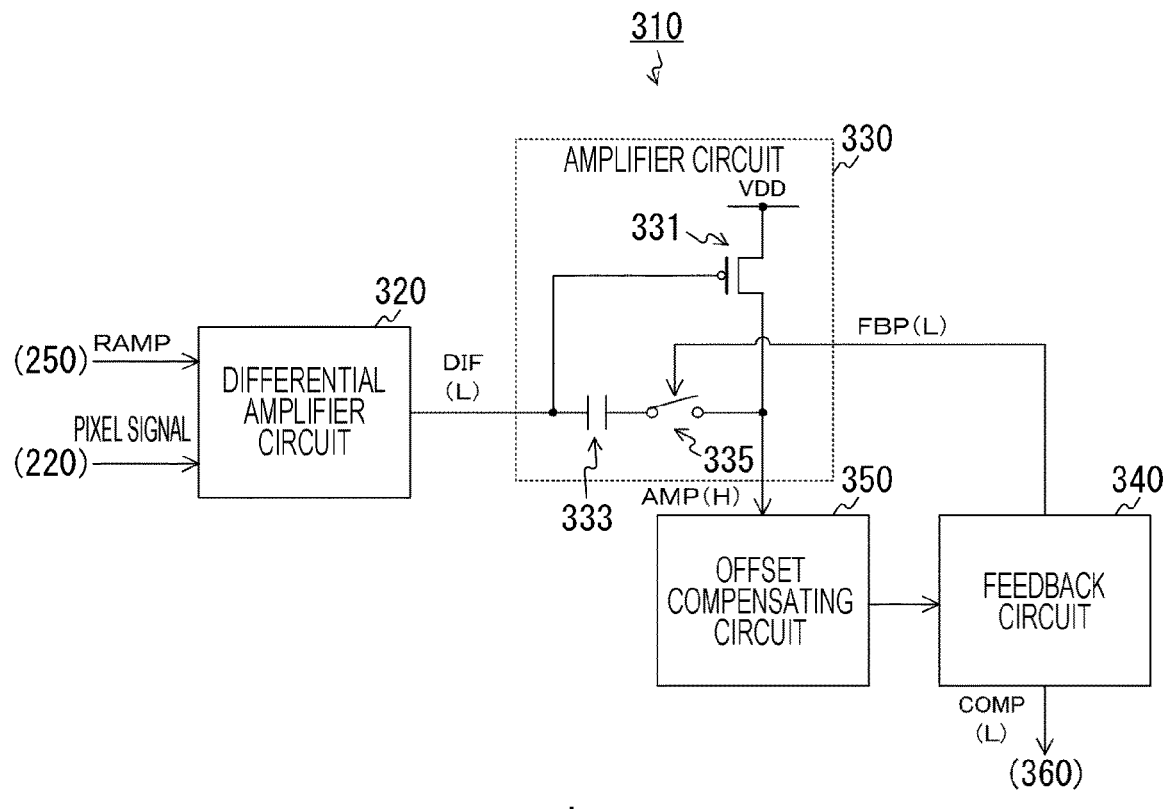

FIG. 7 is a view for explaining an operation of the comparator 310 in the first embodiment of the present technology. In the drawing, a is a view illustrating a state of the comparator 310 in the conversion period until the pixel signal substantially coincides with the ramp signal RAMP. Here, "substantially coincide" means that the two signals to be compared completely coincide with each other, or that a difference between the signals is within a predetermined allowable value. In the drawing, b is a view illustrating a state of the comparator 310 in a period other than the conversion period. Note that the enable signal EN is set to the high level (enable) in a and b in the drawing.

In the conversion period, the differential amplifier circuit 320 outputs, for example, the high-level difference signal DIF. The amplifier circuit 330 inverts the difference signal DIF and outputs a low-level amplified signal AMP. The feedback circuit 340 inverts the amplified signal AMP and outputs a high-level output signal COMP and a high-level feedback signal FBP.

The switch 335 connects the capacitor 333 to the pMOS transistor 331 in parallel in accordance with the high-level feedback signal FBP. By the parallel connection of the capacitor 333, the mirror effect is generated and the capacitance of the amplifier circuit 330 as seen from the input side increases, and noise generated in the ADC 305 in the conversion period may be reduced.

On the other hand, in the period other than the conversion period, the differential amplifier circuit 320 outputs, for example, a low-level difference signal DIF. The amplifier circuit 330 inverts the difference signal DIF and outputs a high-level amplified signal AMP. The feedback circuit 340 inverts the amplified signal AMP and outputs a low-level output signal COMP and a low-level feedback signal FBP.

The switch 335 disconnects the capacitor 333 in accordance with the low-level feedback signal FBP. Therefore, a potential difference between both ends of the capacitor 333 decreases in the period other than the conversion period. Therefore, as compared with a configuration in which the capacitor 333 is always connected in parallel, it is possible to decrease a load of the capacitor 333 and decrease a probability of failure of the capacitor 333.

Furthermore, in the configuration in which the capacitor 333 is always connected in parallel, the potential difference between both the ends of the capacitor 333 changes due to fluctuation of the ramp signal RAMP even after the conversion period elapses. Then, noise due to the change in the potential difference might propagate as a power supply noise component or a ground noise component to another ADC 305 via a power supply system or a ground system. However, since the switch 335 disconnects the capacitor 333 after the conversion period has elapsed, it is possible to suppress the power supply noise component and the like after the conversion period elapses.

Figure 8:
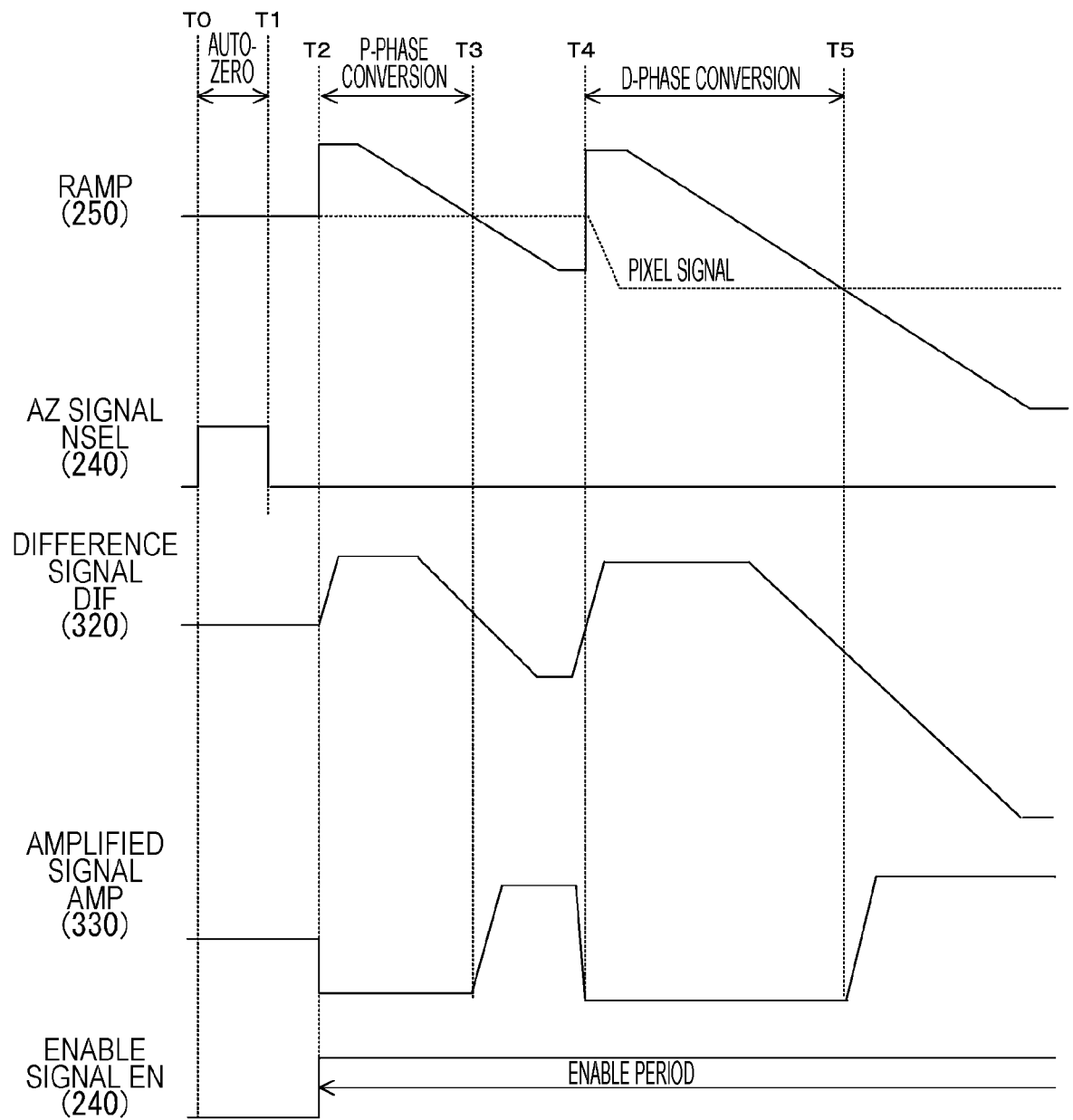
FIG. 8 is a timing chart illustrating an example of an operation of an ADC in the first embodiment of the present technology.

FIG. 8 is a timing chart illustrating an example of an operation of the ADC 305 in the first embodiment of the present technology. In an auto-zero period from predetermined timing T0 to timing T1 within a period of the horizontal synchronization signal, the timing control circuit 240 controls the auto-zero signal NSEL at a high level. Therefore, an offset in the ADC 305 is removed.

At a timing T2 after the timing T1, the DAC 250 sets the ramp signal RAMP to a maximum level and decreases the same at a constant speed after the timing T2. Furthermore, in an enable period after the timing T2, the timing control circuit 240 controls the enable signal EN at the high level (enable).

Then, at a timing T3 after the timing T2, the ramp signal RAMP and the pixel signal substantially coincide with each other. A length of a period from the timing T2 to the timing T3 is proportional to the level of the pixel signal at the time of initialization by the reset transistor 233 (hereinafter referred to as a "P-phase level"). In this period, the counter 360 performs the down-counting of the count value, for example. Therefore, an analog P-phase level may be converted into digital P-phase data.

Furthermore, the differential amplifier circuit 320 outputs the high-level difference signal DIF in the conversion period of the P-phase level from the timing T2 to the timing T3. In the conversion period, the amplifier circuit 330 outputs the low-level amplified signal AMP. Furthermore, the switch 335 connects the capacitor 333 in parallel.

Then, at a timing T4 after the timing T3, the DAC 250 sets the ramp signal RAMP to a maximum level and decreases the same at a constant speed after the timing T4. At a timing T5 after the timing T4, the ramp signal RAMP and the pixel signal substantially coincide with each other. A length of a period from the timing T4 to the timing T5 is proportional to a level of the pixel signal at the time of charge transfer by the transfer transistor 232 (hereinafter referred to as a "D-phase level"). In this period, the counter 360 performs the up-counting of the count value, for example. Therefore, an analog D-phase level may be converted into digital D-phase data. Since the down-counting is performed when the P-phase level is converted, net pixel data of difference between the P-phase data and the D-phase data may be obtained by performing the up-counting when converting the P-phase level. Processing of sampling the P-phase level at the time of reset and the D-phase level at the time of transfer and obtaining the difference between them is referred to as correlated double sampling (CDS) processing.

Note that, although the ADC 305 performs the CDS processing by down-counting and up-counting, the configuration is not limited to this. For example, the ADC 305 may perform only one of the up-counting and down-counting at the time of conversion of the P-phase level and at the time of conversion of the D-phase level. In this case, it is sufficient that the ADC 305 holds the P-phase data in a memory and reads the same at the time of the D-phase level conversion to obtain the difference from the D-phase data.

Furthermore, the differential amplifier circuit 320 outputs a low-level difference signal DIF from the timing T3 to the timing T4. In this period, the amplifier circuit 330 outputs the high-level amplified signal AMP. Furthermore, the switch 335 disconnects the capacitor 333.

Then, the high-level difference signal DIF is output in the conversion period of the D-phase level from the timing T4 to the timing T5. In the conversion period, the amplifier circuit 330 outputs the low-level amplified signal AMP. Furthermore, the switch 335 connects the capacitor 333 in parallel.

Figure 9:
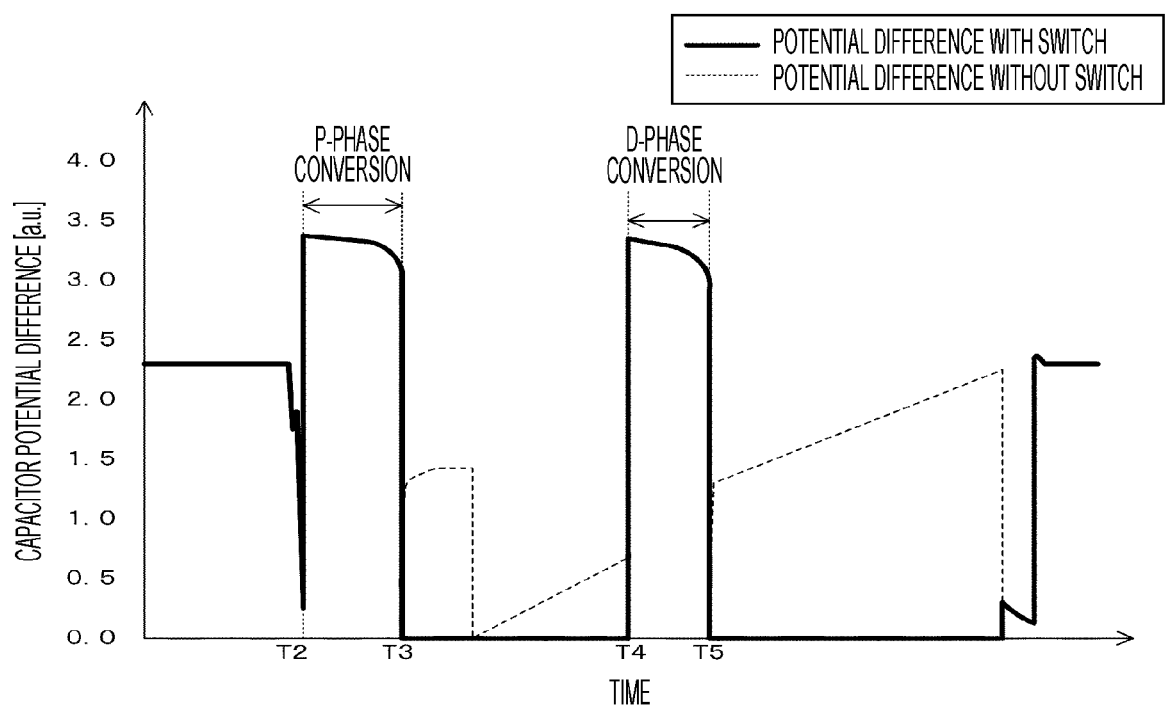
FIG. 9 is a graph illustrating an example of fluctuation in potential difference between both ends of a capacitor and in output of the comparator in the first embodiment of the present technology.
Figure 9:
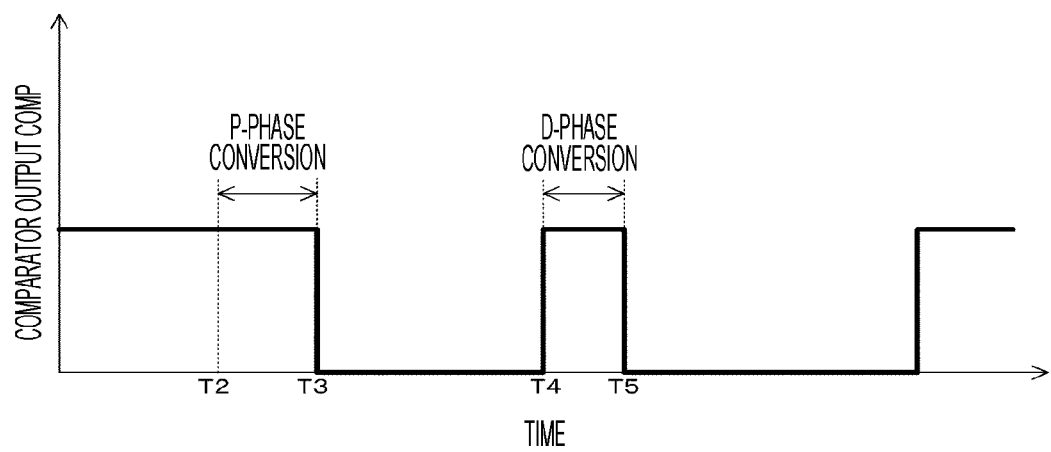

FIG. 9 is a graph illustrating an example of fluctuation in potential difference between both the ends of the capacitor 333 and in output of the comparator 310 in the first embodiment of the present technology. In the drawing, a illustrates a graph illustrating the fluctuation in potential difference between both the ends of the capacitor 333 over time. The potential difference between both the ends of the capacitor 333 in an arbitrary unit is plotted along the ordinate and time is plotted along the abscissa in a in the drawing. Furthermore, a solid line indicates a locus of the potential difference between both the ends of the capacitor 333 in a case of providing the switch 335, and a dotted line indicates a locus of potential difference between both the ends of the capacitor 333 in a comparative example in a case without the switch 335 provided. Furthermore, b in the drawing is a timing chart illustrating fluctuation in the output signal COMP over time.

In the period from the timing T2 to the timing T3 when the P-phase level is converted, the potential difference between both the ends of the capacitor 333 becomes a large value and might reach the power supply potential VDD at maximum. Here, the comparative example in which the capacitor 333 is always connected in parallel without the switch 335 provided is assumed. In this comparative example, after the timing T3 when the conversion of the P-phase level ends, the potential difference between both the ends of the capacitor changes due to the fluctuation in the ramp signal RAMP. On the other hand, in a case where the switch 335 is provided, the switch 335 disconnects the capacitor 333, so that the potential difference between both the ends of the capacitor 333 decreases and becomes a constant value.

Furthermore, the comparator 310 outputs the high-level output signal COMP in the conversion period of the P-phase level, and outputs the low-level output signal COMP after the conversion period.

Furthermore, in the period from the timing T4 to the timing T5 in which the D-phase level is converted, similarly, the potential difference between both the ends of the capacitor 333 becomes a large value. After the timing T5, in the comparative example without the switch 335 provided, the potential difference between both the ends of the capacitor 333 changes due to the fluctuation in the ramp signal RAMP. On the other hand, in a case where the switch 335 is provided, the switch 335 disconnects the capacitor 333, so that the potential difference between both the ends of the capacitor 333 decreases and becomes a constant value.

Furthermore, the comparator 310 outputs the high-level output signal COMP in the conversion period of the D-phase level, and outputs the low-level output signal COMP after the conversion period.

In this manner, since the switch 335 disconnects the capacitor 333 in the period other than the conversion period of the P-phase level and the D-phase level, the fluctuation in the potential difference between both the ends of the capacitor 333 may be suppressed. Therefore, it becomes possible to decrease the load of the capacitor 333 and decrease a probability of failure of the capacitor 333.

Furthermore, the period in which the capacitor 333 may be disconnected becomes longer as brightness is lower. For example, in a certain high brightness environment, the capacitor may be disconnected over a period of 20% the period of the horizontal synchronization signal. On the other hand, in an environment where the brightness is lower than that, since the signal level is low and the conversion period is short, the capacitor 333 may be disconnected over a period of 47% the period of the horizontal synchronization signal, for example. In this manner, the load of the capacitor 333 may be decreased particularly in a low-brightness environment.

Figure 10:
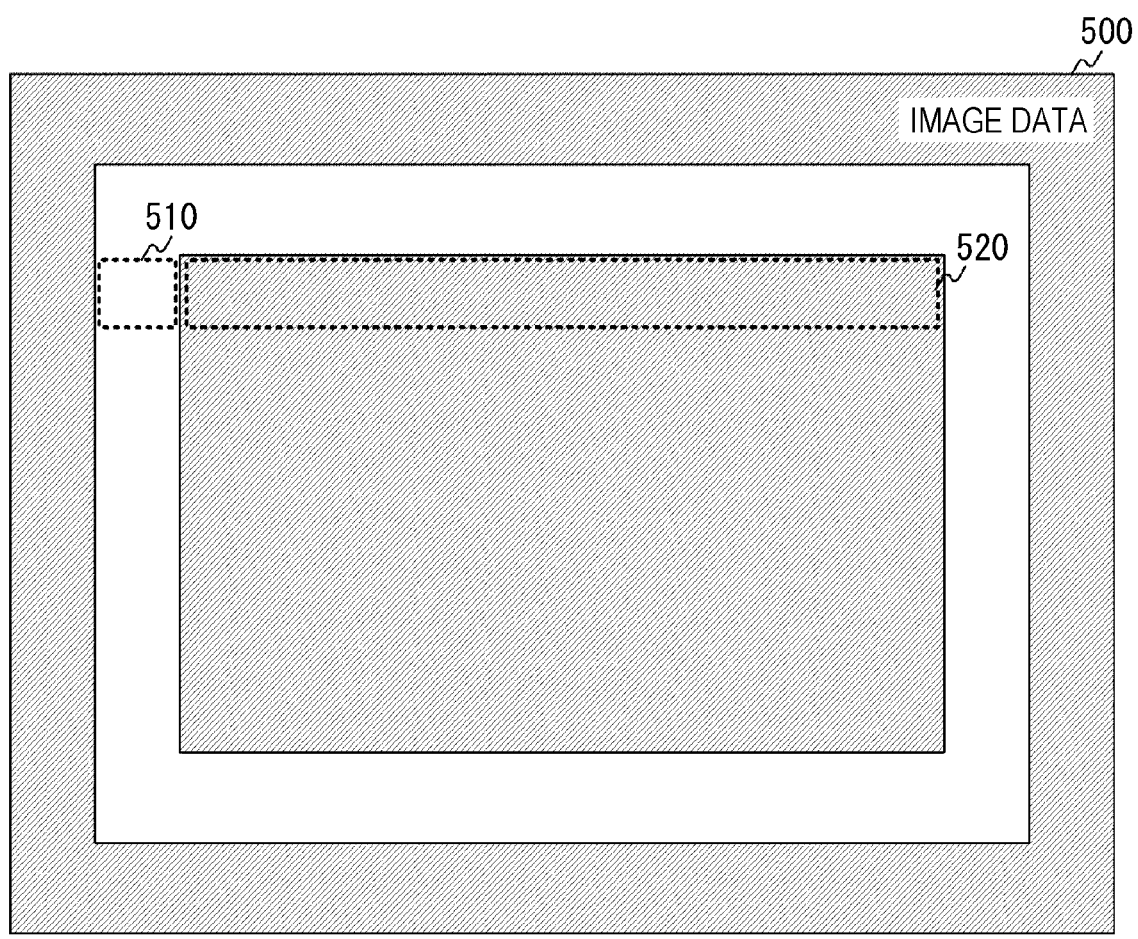
FIG. 10 is an example of image data in the first embodiment of the present technology.

FIG. 10 is an example of image data 500 in the first embodiment of the present technology. It is assumed that a bright area 510 of the image data 500 has high brightness, and that a dark area 520 other than the bright area 510 having the same row address has low brightness.

Here, the comparative example in which the capacitor 333 is always connected in parallel without the switch 335 provided is assumed. In this comparative example, when the ADCs corresponding to the dark area 520 operate simultaneously in a certain row, the power supply noise component and the ground noise component from the ADCs propagate to the ADCs corresponding to the bright area 510 via the capacitor. Therefore, an error occurs in the ADCs corresponding to the bright area 510, and a signal quality of the pixel data is degraded.

However, if the capacitor 333 is disconnected by the switch 335 at the end of AD conversion, it is possible to suppress propagation of the noise component and improve the signal quality.

Figure 11:
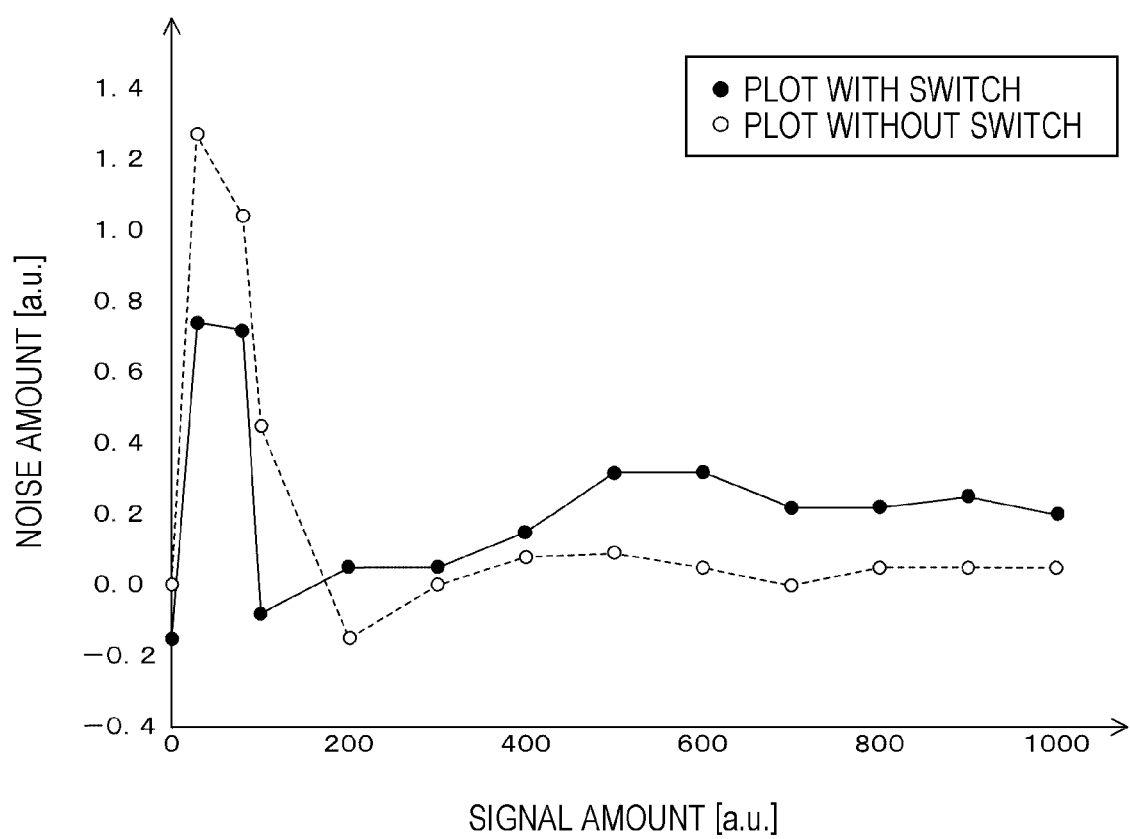
FIG. 11 is a graph illustrating an example of a noise amount with respect to a signal amount in the first embodiment of the present technology.

FIG. 11 is a graph illustrating an example of a noise amount with respect to a signal amount in the first embodiment of the present technology. A significant signal amount in the pixel data is plotted along the abscissa in the drawing, and the noise amount in the pixel data is plotted along the ordinate in the drawing. Furthermore, a black circle indicates a plot in a case where the switch 335 is provided, and a white circle indicates a plot of the comparative example in a case where the switch 335 is not provided. As illustrated in the drawing, in a case where the switch 335 is provided, the noise amount with respect to the signal amount may be decreased in the low brightness area as compared with that in the comparative example.

[Operation Example of Solid-State Imaging Element]

Figure 12:
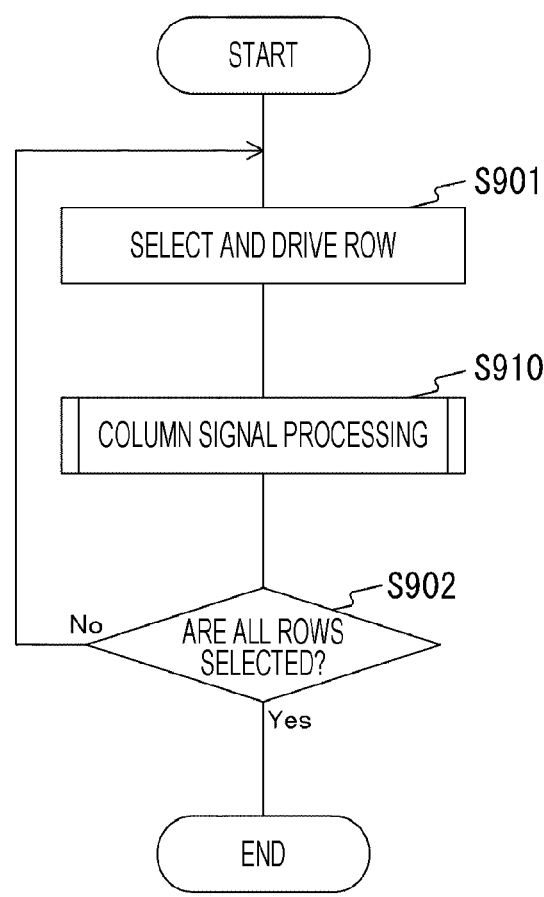
FIG. 12 is a flowchart illustrating an example of an operation of a solid-state imaging element in the first embodiment of the present technology.

FIG. 12 is a flowchart illustrating an example of an operation of the solid-state imaging element 200 in the first embodiment of the present technology. This operation starts, for example, when a predetermined application for imaging the image data is executed.

The row selecting circuit 210 in the solid-state imaging element 200 selects any row and drives the same (step S901). Then, the column signal processing unit 300 executes column signal processing for performing AD conversion for every column (step S910). The solid-state imaging element 200 determines whether or not all the rows are selected (step S902).

In a case where not all the rows are selected (step S902: No), the solid-state imaging element 200 repeatedly executes step S901 and subsequent steps. On the other hand, in a case where all the rows are selected (step S902: Yes), the solid-state imaging element 200 finishes the operation for imaging the image data. In a case of imaging a plurality of image data, the above-described processing is repeatedly executed in synchronization with the vertical synchronization signal VSYNC.

Figure 13:
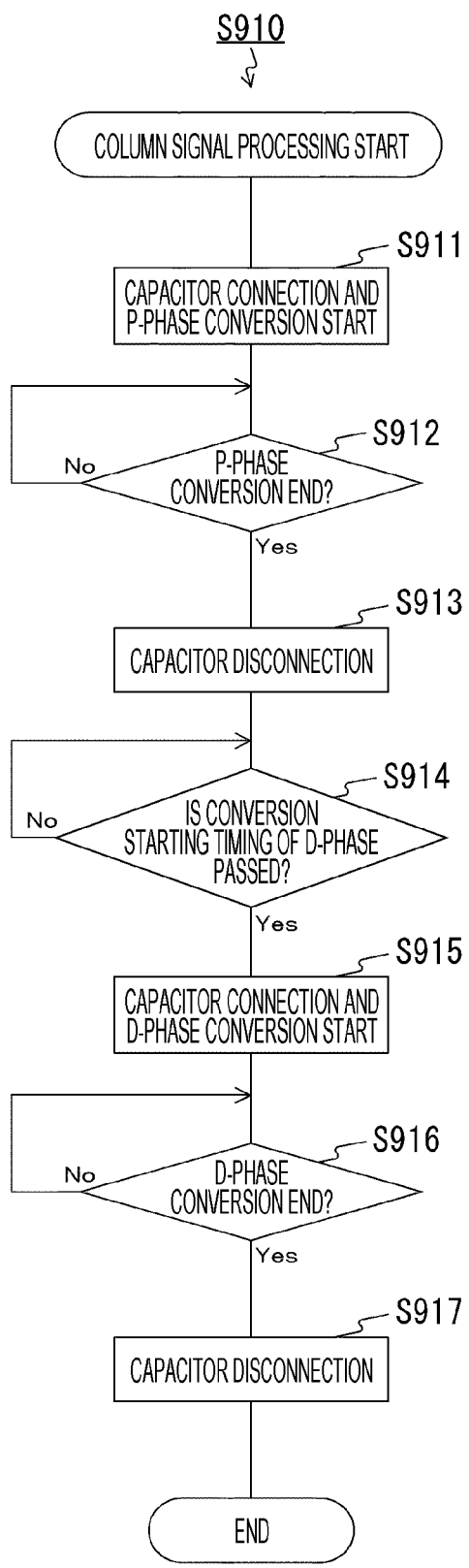
FIG. 13 is a flowchart illustrating an example of column signal processing in the first embodiment of the present technology.

FIG. 13 is a flowchart illustrating an example of the column signal processing in the first embodiment of the present technology. First, the ADC 305 connects the capacitors 333 in parallel and starts the conversion of the P-phase level (step S911). Then, the ADC 305 determines whether or not the conversion of the P-phase level is finished (step S912). In a case where the conversion of the P-phase level is not finished (step S912: No), the ADC 305 repeats step S912.

On the other hand, in a case where the conversion of the P-phase level is finished (step S912: Yes), the ADC 305 disconnects the one end of the capacitor 333 (step S913), and determines whether or not it passes through a starting timing of the conversion of the D-phase level (step S914). In a case where it does not pass through the starting timing of the conversion of the D-phase level (step S914: No), the ADC 305 repeats step S914.

In a case where it passes through the starting timing of the conversion of the D-phase level (step S914: Yes), the ADC 305 connects the capacitor 333 in parallel and starts the conversion of the D-phase level (step S915). Then, the ADC 305 determines whether or not the conversion of the D-phase level is finished (step S916). In a case where the conversion of the D-phase level is not finished (step S916: No), the ADC 305 repeats step S916.

On the other hand, in a case where the conversion of the D-phase level is finished (step S916: Yes), the ADC 305 disconnects the one end of the capacitor 333 (step S917). After step S917, the ADC 305 finishes the column signal processing.

In this manner, since the switch 335 disconnects the capacitor 333 in the period other than the conversion period of the P-phase level or the D-phase level in the first embodiment of the present technology, the fluctuation in potential difference between both the ends of the capacitor 333 in the period other than the conversion period may be suppressed. Therefore, the noise generated in the ADC 305 in the period other than the conversion period may be suppressed. Furthermore, it is possible to decrease the load of the capacitor 333 and suppress the occurrence of the failure of the capacitor 333. Therefore, reliability of the ADC 305 may be improved.

[First Variation]

In the first embodiment described above, the capacitance as seen from the input side is increased by the mirror effect; however, if the capacitance is too large, the cutoff frequency is lowered correspondingly, and there is a possibility that the band to be passed becomes too narrow. An amplifier circuit 330 according to a first variation of the first embodiment is different from that of the first embodiment in that the capacitance as seen from the input side is decreased.

Figure 14:
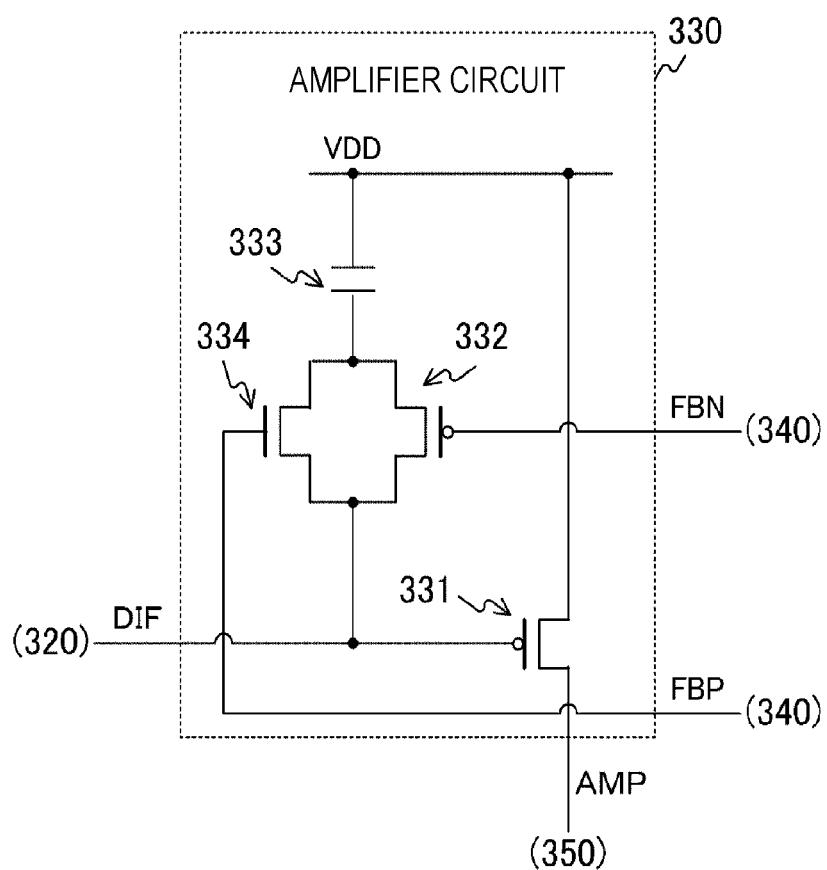
FIG. 14 is a circuit diagram illustrating a configuration example of an amplifier circuit in a first variation of the first embodiment of the present technology.

FIG. 14 is a circuit diagram illustrating a configuration example of the amplifier circuit 330 in the first variation of the first embodiment of the present technology. The amplifier circuit 330 in the first variation of the first embodiment is different from that of the first embodiment in that connection destinations of terminals of a pMOS transistor 332, a capacitor 333, and an nMOS transistor 334 are different.

One end of the capacitor 333 is connected to a terminal of a power supply potential VDD. Sources and drains of the pMOS transistor 332 and the nMOS transistor 334 are connected to the other end of the capacitor 333 and a gate of a pMO transistor 331, respectively. Note that the terminal of the power supply potential VDD is an example of a connection terminal recited in claims.

With the above-described configuration, the mirror effect does not occur, so that the capacitance as seen from the input side is the same as the capacitance of the capacitor 333. Since the capacitance is smaller than that in a case where the mirror effect occurs, the cutoff frequency may be made high.

In this manner, in the first variation of the first embodiment of the present technology, since the one end of the capacitor 333 is connected to the terminal of the power supply potential VDD, the capacitance as seen from the input side may be decreased. Therefore, the cutoff frequency may be made higher than that in a case where the mirror effect occurs.

[Second Variation]

In the first variation of the first embodiment described above, the pMOS transistor 332 and the nMOS transistor 334 are arranged between the capacitor 333 and the gate of the pMOS transistor 331. However, the pMOS transistor 332 and the nMOS transistor 334 may also be arranged between the capacitor 333 and the terminal of the power supply potential VDD. An amplifier circuit 330 in a second variation of the first embodiment is different from that of the first variation of the first embodiment in that the pMOS transistor 332 and nMOS transistor 334 are arranged on a power supply side.

Figure 15:
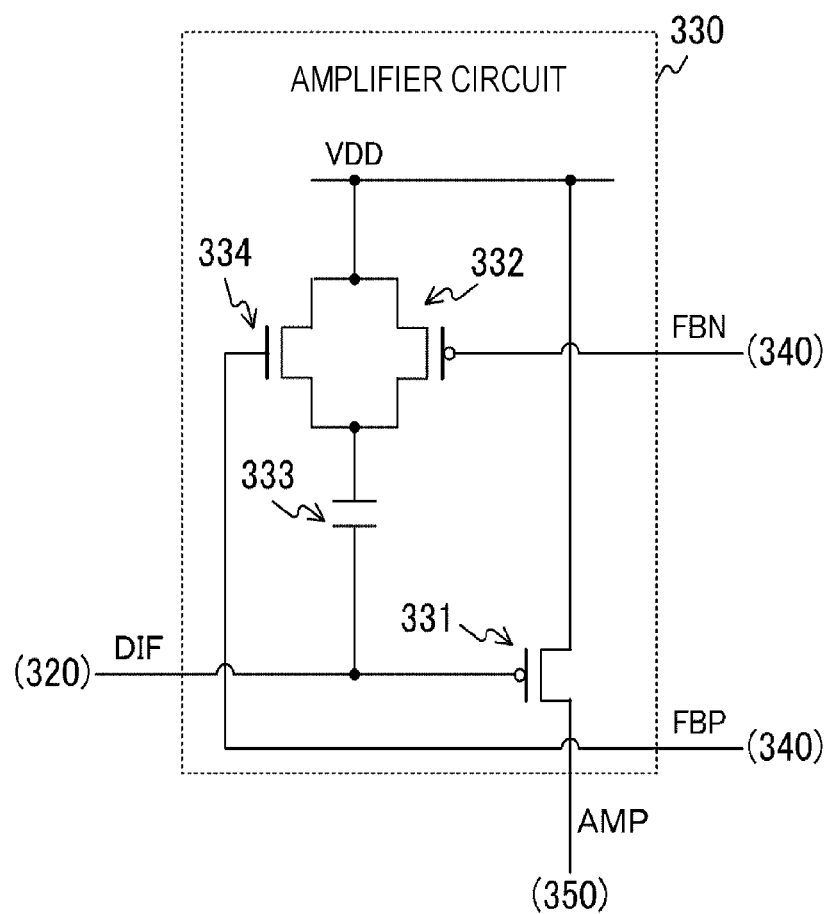
FIG. 15 is a circuit diagram illustrating a configuration example of an amplifier circuit in a second variation of the first embodiment of the present technology.

FIG. 15 is a circuit diagram illustrating a configuration example of the amplifier circuit 330 in the second variation of the first embodiment of the present technology. The amplifier circuit 330 in the second variation of the first embodiment is different from that of the first variation of the first embodiment in that connection destinations of terminals of the pMOS transistor 332, capacitor 333, and nMOS transistor 334 are different.

One end of the capacitor 333 is connected to a gate of an nMO transistor 331. Sources and drains of the pMOS transistor 332 and the nMOS transistor 334 are connected to the other end of the capacitor 333 and the terminal of the power supply potential VDD, respectively.

In this manner, in the second variation of the first embodiment of the present technology, the pMOS transistor 332 and the nMOS transistor 334 are arranged between the capacitor 333 and the terminal of the power supply potential VDD, so that the terminal on a power supply side of the capacitor 333 may be disconnected.

[Third Variation]

In the first variation of the first embodiment described above, the one end of the capacitor 333 is connected to the terminal of the power supply potential VDD, but this may also be connected to a terminal of a reference potential (such as a ground potential GND). An amplifier circuit 330 in a third variation of the first embodiment is different from that of the first variation of the first embodiment in that one end of the capacitor 333 is connected to the terminal of the reference potential.

Figure 16:
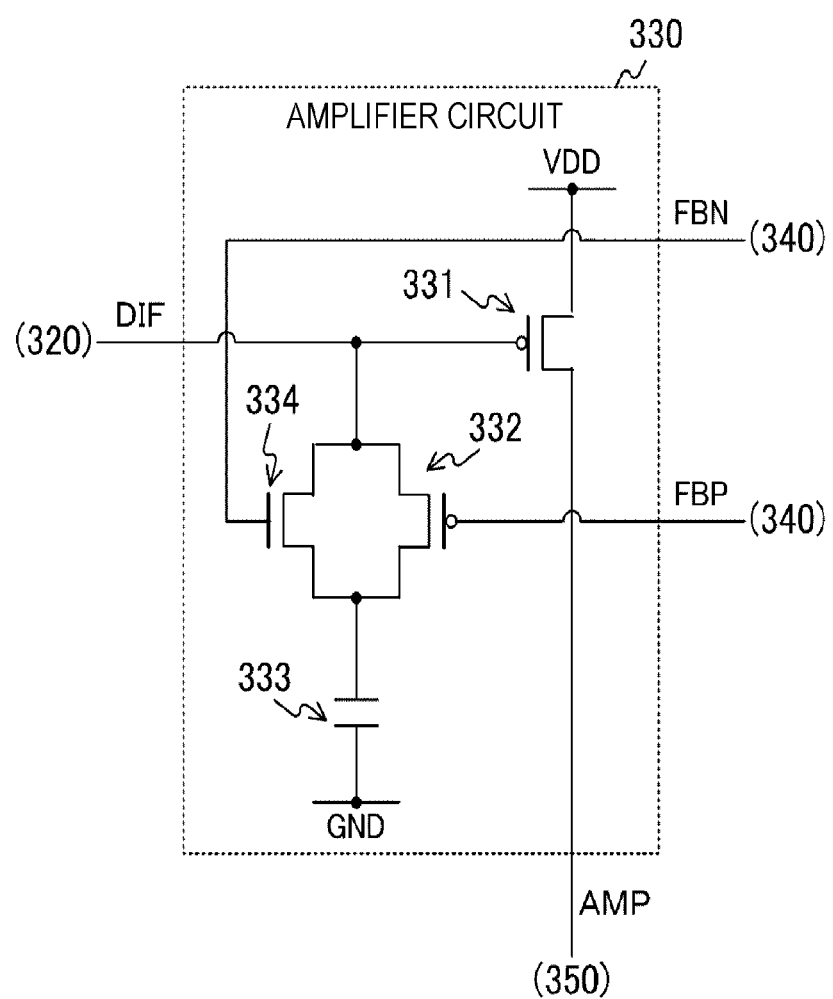
FIG. 16 is a circuit diagram illustrating a configuration example of an amplifier circuit in a third variation of the first embodiment of the present technology.

FIG. 16 is a circuit diagram illustrating a configuration example of the amplifier circuit 330 in the third variation of the first embodiment of the present technology. The amplifier circuit 330 in the third variation of the first embodiment is different from that of the first variation of the first embodiment in that a connection destination of one end of the capacitor 333 is different. The one end of the capacitor 333 is connected not to the terminal of the power supply potential VDD but to the terminal of the reference potential (such as the ground potential GND). Therefore, the number of connection terminals to a power supply line may be made smaller than that of the first variation of the first embodiment in which the one end of the capacitor 333 is connected to the terminal of the power supply potential VDD.

In this manner, in the third variation of the first embodiment of the present technology, since the one end of the capacitor 333 is connected to the terminal of the reference potential, the number of connection terminals to the power supply line may be decreased.

[Fourth Variation]

In the third variation of the first embodiment described above, the pMOS transistor 332 and the nMOS transistor 334 are arranged between the capacitor 333 and the gate of the pMOS transistor 331. However, the pMOS transistor 332 and the nMOS transistor 334 may also be arranged between the capacitor 333 and the terminal of the reference potential. The amplifier circuit 330 in a fourth variation of the first embodiment is different from that of the third variation of the first embodiment in that the pMOS transistor 332 and the nMOS transistor 334 are arranged on a ground side.

Figure 17:
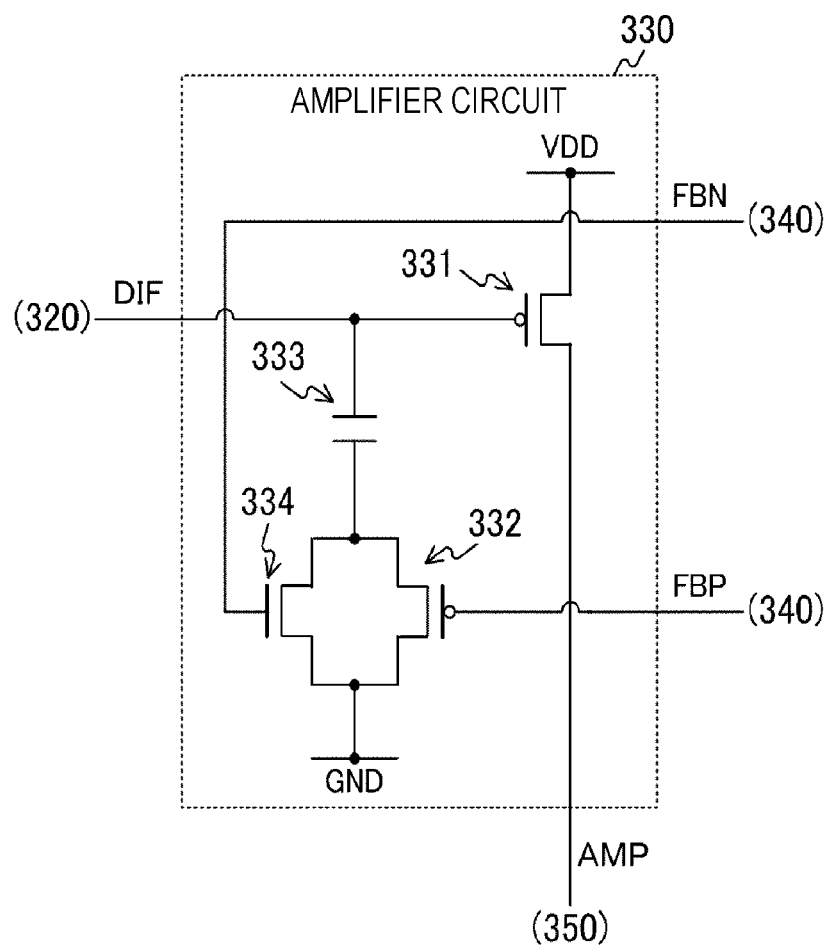
FIG. 17 is a circuit diagram illustrating a configuration example of an amplifier circuit in a fourth variation of the first embodiment of the present technology.

FIG. 17 is a circuit diagram illustrating a configuration example of the amplifier circuit 330 in the fourth variation of the first embodiment of the present technology. The amplifier circuit 330 in the fourth variation of the first embodiment is different from that of the third variation of the first embodiment in that connection destinations of terminals of the pMOS transistor 332, capacitor 333, and nMOS transistor 334 are different.

One end of the capacitor 333 is connected to a gate of a pMO transistor 331. Sources and drains of the pMOS transistor 332 and the nMOS transistor 334 are connected to the other end of the capacitor 333 and the terminal of the reference potential (such as the ground potential GND), respectively.

In this manner, in the fourth variation of the first embodiment of the present technology, the pMOS transistor 332 and the nMOS transistor 334 are arranged between the capacitor 333 and the terminal of the ground potential GND, so that the terminal on the ground side of the capacitor 333 may be disconnected.

[Fifth Variation]

In the first embodiment described above, the aluminum electrolytic capacitor, the layered ceramic capacitor and the like are used as the capacitor 333; however, the capacitors are larger in size than a transistor and have a large mounting area. An amplifier circuit 330 in a fifth variation of the first embodiment is different from that of the first embodiment in that the capacitor is made smaller in size.

Figure 18:
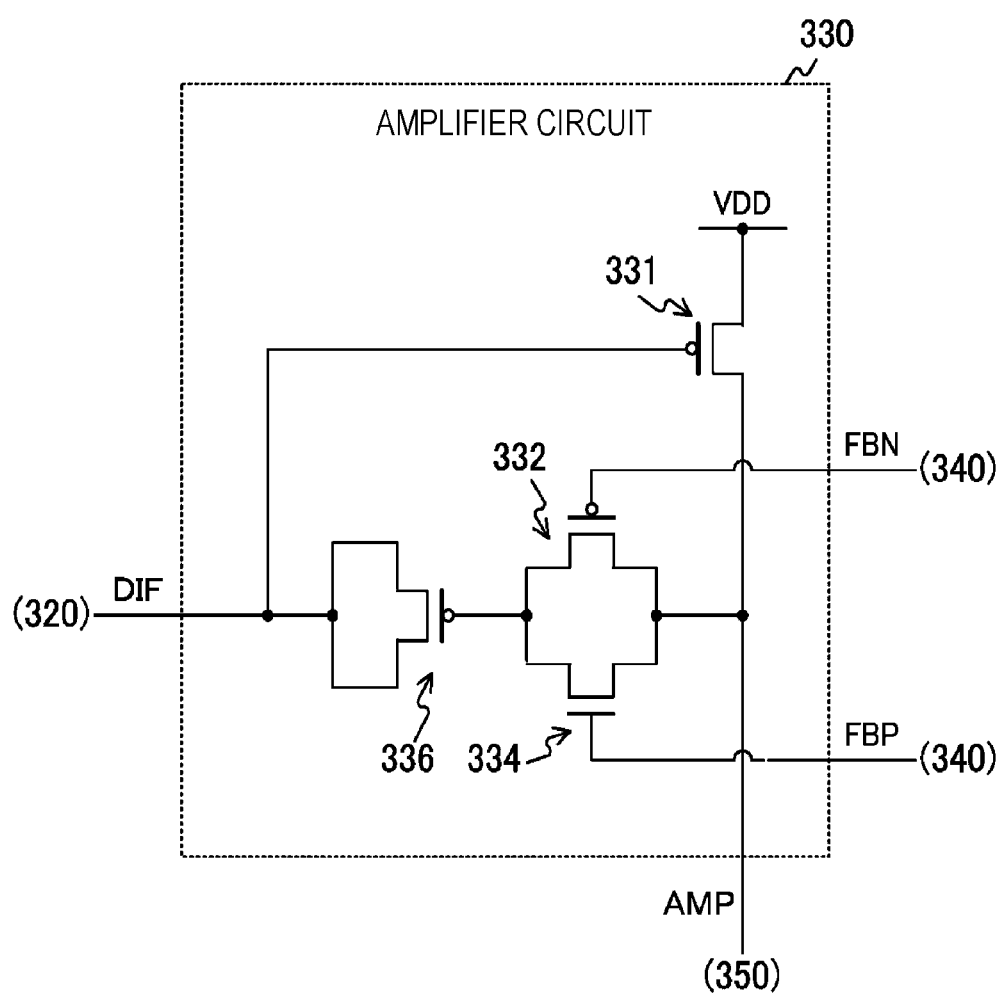
FIG. 18 is a circuit diagram illustrating a configuration example of an amplifier circuit in a fifth variation of the first embodiment of the present technology.

FIG. 18 is a circuit diagram illustrating a configuration example of the amplifier circuit 330 in the fifth variation of the first embodiment of the present technology. The amplifier circuit 330 in the fifth variation of the first embodiment is different from that of the first embodiment in including a pMOS transistor 336 in place of the capacitor 333.

Sources and drains of the pMOS transistor 336 are connected to a gate of a pMOS transistor 331. Furthermore, a gate of the pMOS transistor 336 is connected to a pMOS transistor 332 and an nMOS transistor 334. Therefore, the pMOS transistor 336 serves as a MOS capacitor. A size of the MOS capacitor is equivalent to that of the transistor and is smaller than that of an electric field capacitor and the like.

Note that in the first, second, third, and fourth variations of the first embodiment, the MOS capacitor may also be provided as in the fifth variation.

In this manner, in the fifth variation of the first embodiment of the present technology, since the MOS capacitor is arranged, the mounting area may be made smaller than that in a case where the aluminum electrolytic capacitor and the like is used.

[Sixth Variation]

In the first embodiment described above, the nMOS transistors 326 and 327 are used as the differential pair, but pMOS transistors may also be used as the differential pair instead. A differential amplifier circuit in the fifth variation of the first embodiment is different from that of the first embodiment in that the pMOS transistors are used as the differential pair.

Figure 19:
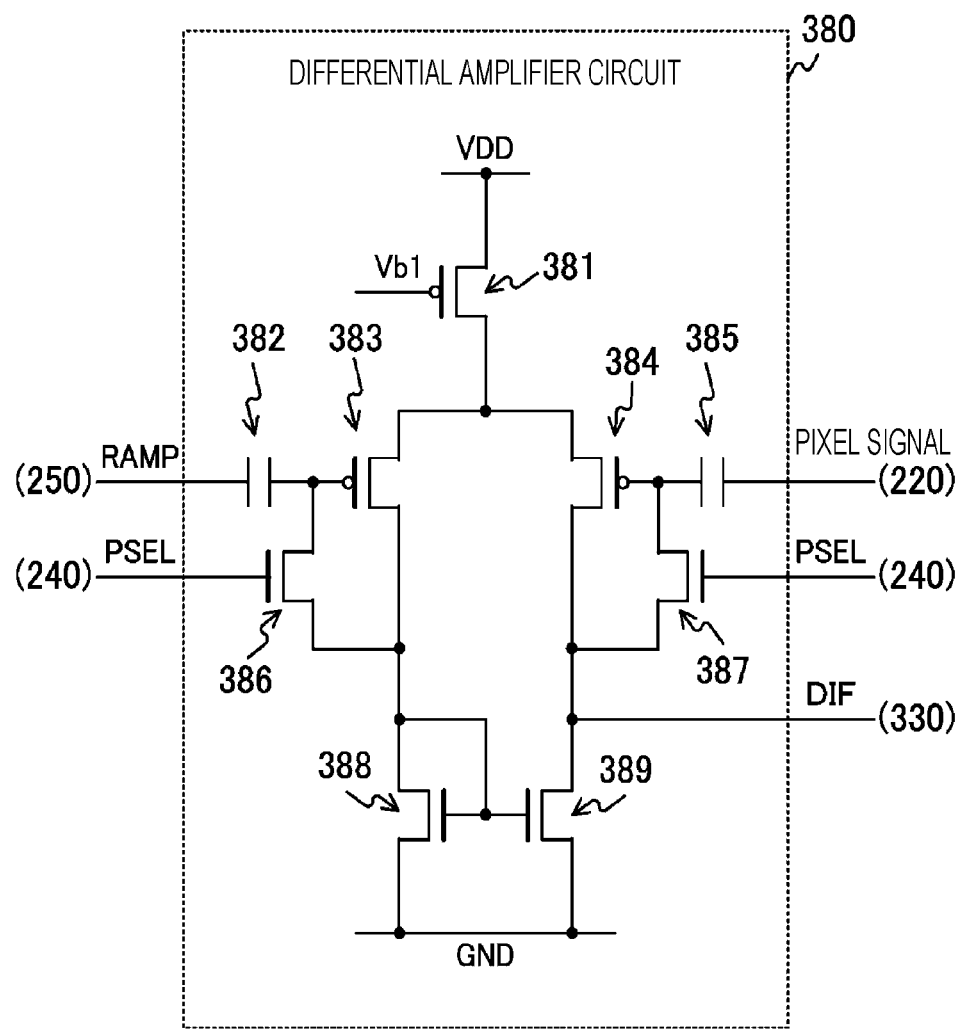
FIG. 19 is a circuit diagram illustrating a configuration example of a differential amplifier circuit in a sixth variation of the first embodiment of the present technology.

FIG. 19 is a circuit diagram illustrating a configuration example of a differential amplifier circuit 380 in the sixth variation of the first embodiment of the present technology. In an ADC 305 in the sixth variation of the first embodiment, the differential amplifier circuit 380 is arranged instead of a differential amplifier circuit 320.

The differential amplifier circuit 380 is provided with pMOS transistors 381, 383, and 384, capacitors 382 and 385, and nMOS transistors 386 to 389.

A drain of the pMOS transistor 381 is connected to a terminal of a power supply potential VDD, and a bias voltage Vb1 is applied to a gate thereof. Furthermore, a source of the pMOS transistor 381 is connected to drains of the pMOS transistors 383 and 384.

The pMOS transistor 383 and the nMOS transistor 388 are connected in series to a terminal of a reference potential (ground potential GND and the like). The pMOS transistor 384 and the nMOS transistor 389 are also connected in series to the terminal of the reference potential. A gate of the pMOS transistor 383 is connected to one end of the capacitor 382, and a gate of the pMOS transistor 384 is connected to one end of the capacitor 385. The pMOS transistors 383 and 384 serve as a so-called p-receiving differential pair.

A source and a drain of the nMOS transistor 386 are connected to a source of the nMOS transistor 388 and one end of the capacitor 382. A ramp signal RAMP is input to the other end of the capacitor 382. An auto-zero signal PSEL from a timing control circuit 240 is input to a gate of the nMOS transistor 386.

Furthermore, a source and a drain of the nMOS transistor 387 are connected to a source of the nMOS transistor 389 and one end of the capacitor 385. A pixel signal is input to the other end of the capacitor 385. The auto-zero signal PSEL from the timing control circuit 240 is input to a gate of the nMOS transistor 387.

A gate of the nMOS transistor 388 is connected to a source thereof and a gate of the nMOS transistor 389. Furthermore, the source of the nMOS transistor 389 is connected to the amplifier circuit 330.

With the above-described configuration, the differential amplifier circuit 380 amplifies a difference between the ramp signal RAMP and the pixel signal and outputs the same as a difference signal DIF to the amplifier circuit 330.

In this manner, in the sixth variation of the first embodiment of the present technology, the capacitor 333 is disconnected in the configuration in which the pMOS transistors 383 and 384 are used as the differential pair, so that reliability of the ADC 305 may be improved as in the first embodiment.

2. Second Embodiment

In the first embodiment described above, each of the circuits in the solid-state imaging element 200 is provided on a single semiconductor chip. However, in a case where this is provided on the single semiconductor chip, it is necessary to arrange a row selecting circuit 210 and the like in addition to a pixel array unit 220 on the chip. Therefore, if an area of the semiconductor chip is fixe, an area of the pixel array unit 220 decreases by the circuits other than the pixel array unit 220. In order to increase the area of the pixel array unit 220, for example, it is only required that the circuits in the solid-state imaging element 200 are arranged in a distributed manner in a plurality of layered semiconductor chips. The solid-state imaging element 200 according to the second embodiment is different from that of the first embodiment in that the circuits are arranged in a distributed manner on a plurality of layered semiconductor chips.

Figure 20:
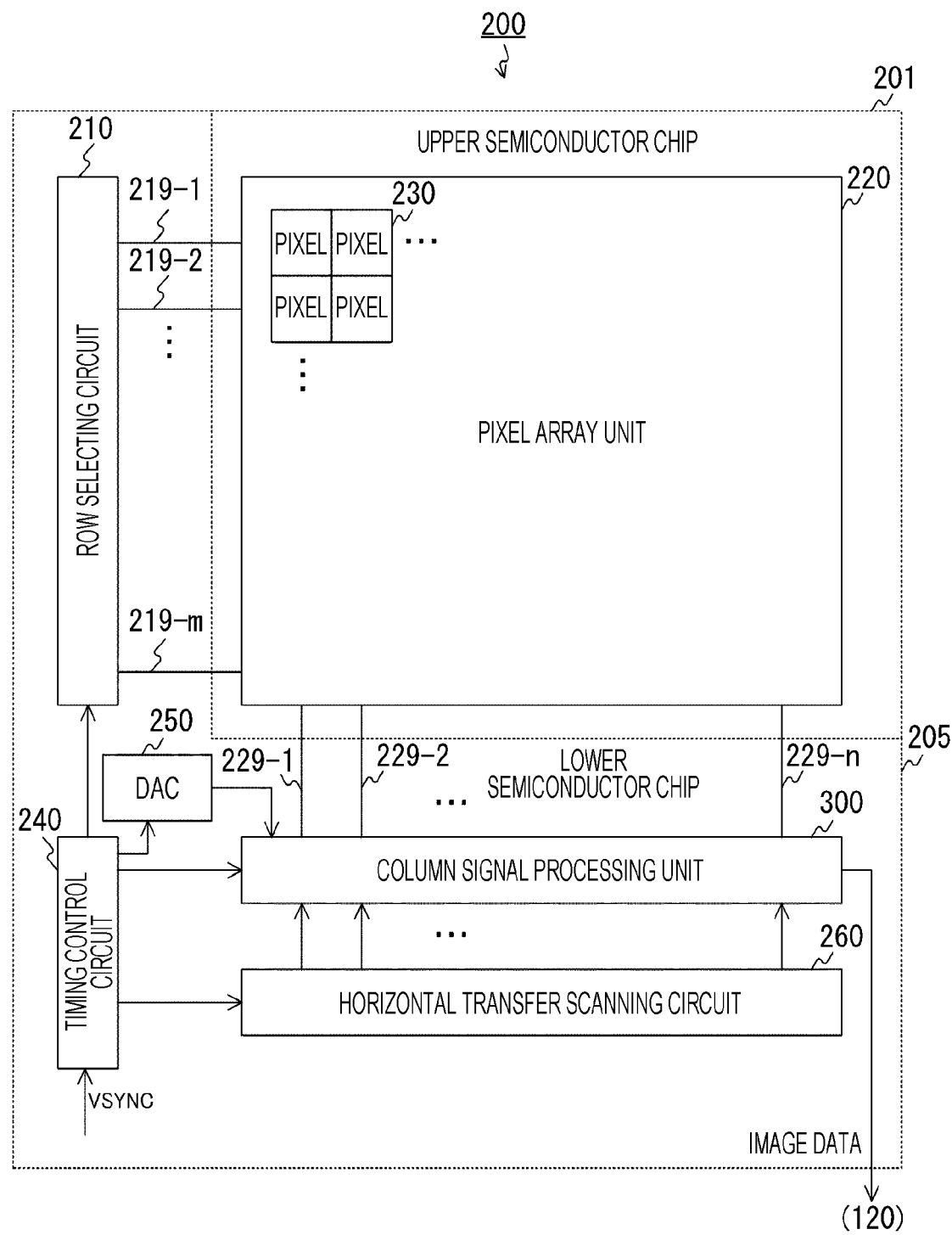
FIG. 20 is a block diagram illustrating a configuration example of a solid-state imaging element in a second embodiment of the present technology.

FIG. 20 is a block diagram illustrating a configuration example of the solid-state imaging element 200 in the second embodiment of the present technology. The solid-state imaging element 200 is provided with an upper semiconductor chip 201 and a lower semiconductor chip 205. The upper semiconductor chip 201 is layered above the lower semiconductor chip 205 with a light receiving surface side up.

Furthermore, a pixel array unit 220 is arranged on the upper semiconductor chip 201. A row selecting circuit 210, a timing control circuit 240, a DAC 250, a column signal processing unit 300, and a horizontal transfer scanning circuit 260 are arranged on the lower semiconductor chip 205. Note that the upper semiconductor chip 201 is an example of a first semiconductor chip recited in claims, and the lower semiconductor chip 205 is an example of a second semiconductor chip recited in claims.

Note that although only the pixel array unit 220 is arranged on the upper semiconductor chip 201, the circuits other than the pixel array unit 220 may be further arranged on the upper semiconductor chip 201. For example, a comparator 310 in a column signal processing unit 300 may be further arranged on the upper semiconductor chip 201. Furthermore, although the circuits in the solid-state imaging element 200 are arranged on two layered semiconductor chips, they may also be arranged on three or more layered semiconductor chips.

Figure 21:
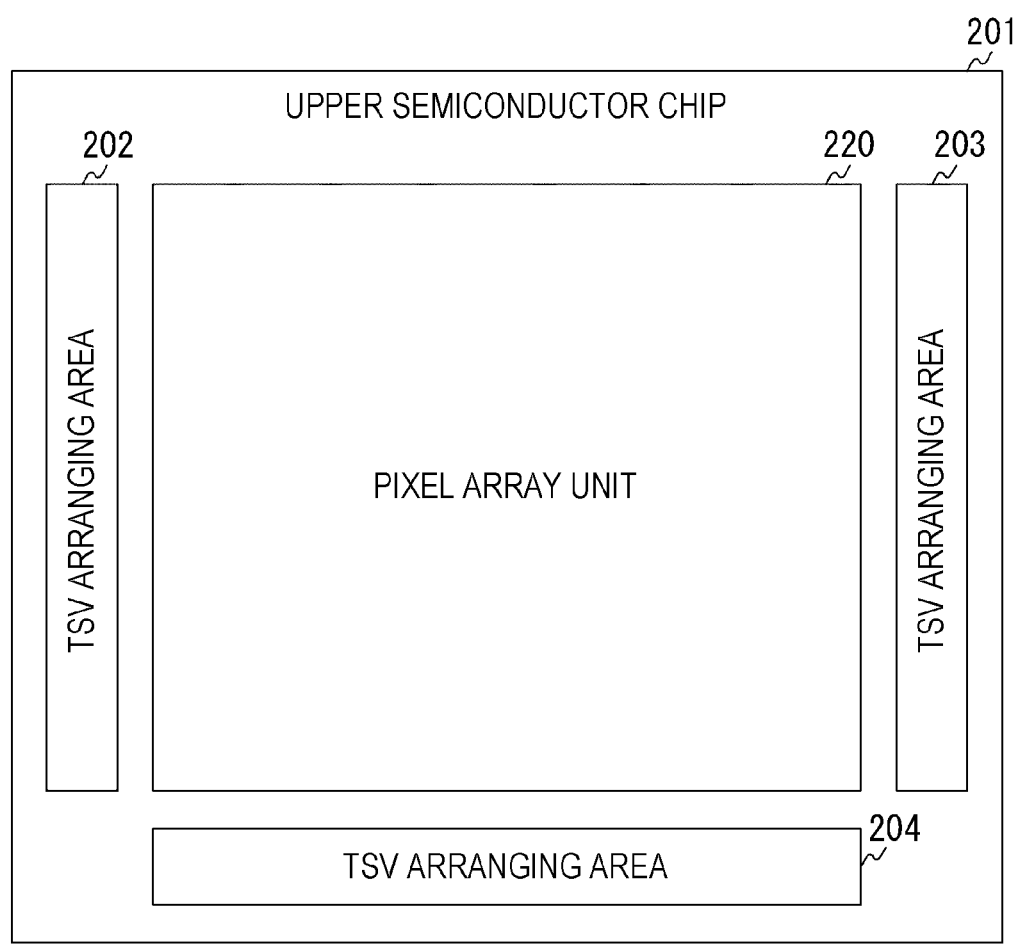
FIG. 21 is a plan view illustrating a configuration example of an upper semiconductor chip in the second embodiment of the present technology.

FIG. 21 is a plan view illustrating a configuration example of the upper semiconductor chip 201 in the second embodiment of the present technology. On the upper semiconductor chip 201, the pixel array unit 220 and TSV arranging areas 202, 203, and 204 for arranging through-silicon vias (TSVs) are arranged. A plurality of TSVs is arranged in each of the TSV arranging areas 202, 203 and 204. An analog signal and a digital signal are transmitted between the upper semiconductor chip 201 and the lower semiconductor chip 205 through these TSVs.

Here, it is desirable that the TSV for transmitting the analog signal is arranged separately from the TSV for transmitting the digital signal. For example, the TSVs which transmit the analog signals are arranged in the TSV arranging area 204, and the TSVs which transmit the digital signals are arranged in the TSV arranging areas 202 and 203.

In this manner, in the second embodiment of the present technology, the pixel array unit 220 is arranged on the upper semiconductor chip 201 and the remaining circuits are arranged on the lower semiconductor chip 205, so that it is possible to make the area of the pixel array unit 220 wider than that in a case of arranging the same on the single semiconductor chip.

<3. Application Example to Mobile Body>

The technology according to the present disclosure (present technology) is applicable to various products. For example, the technology according to the present disclosure may also be realized as a device mounted on any type of mobile body such as an automobile, an electric automobile, a hybrid electric automobile, a motorcycle, a bicycle, a personal mobility, an airplane, a drone, a ship, and a robot.

Figure 22:
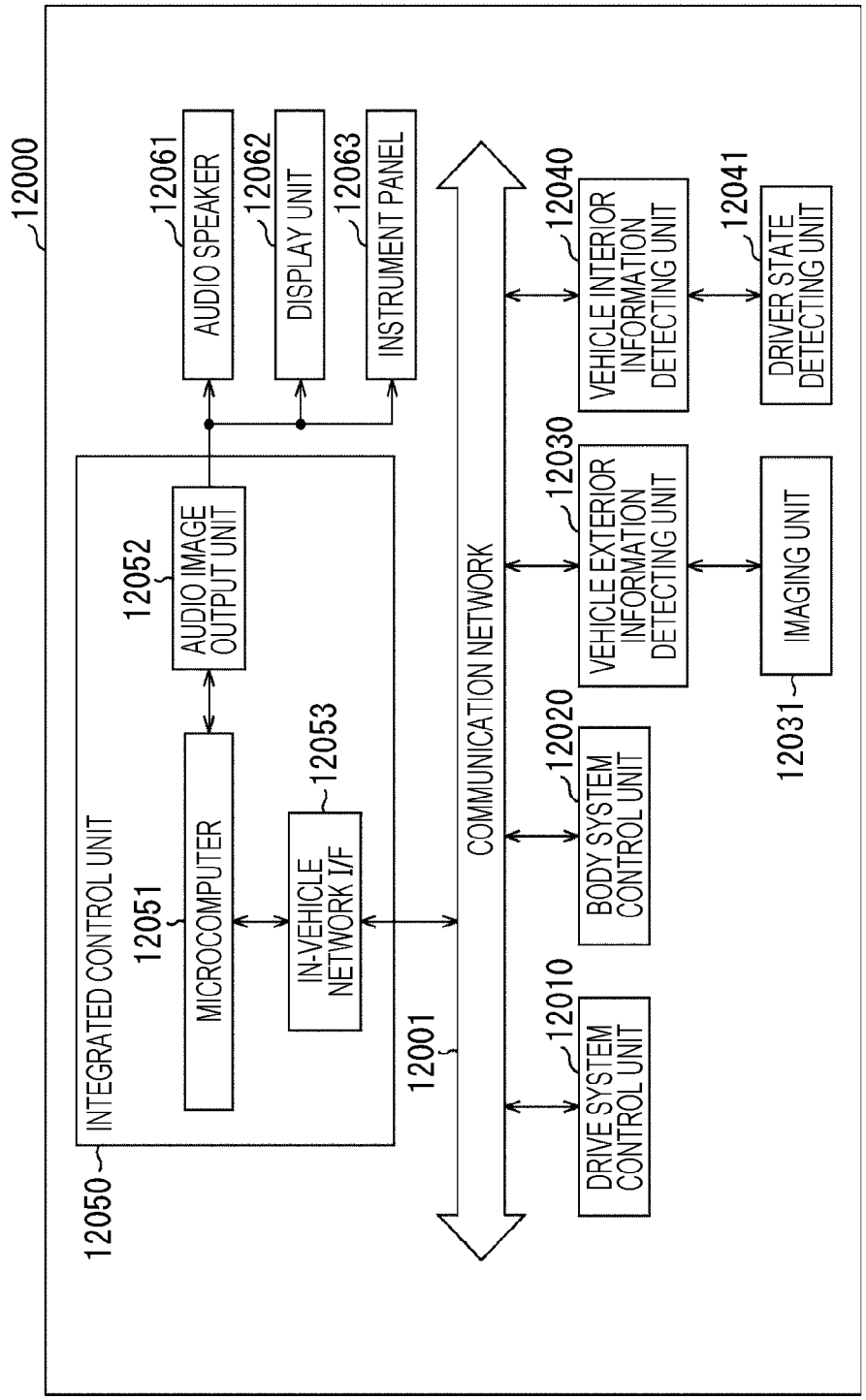
FIG. 22 is a block diagram illustrating a schematic configuration example of a vehicle control system.

FIG. 22 is a block diagram illustrating a schematic configuration example of a vehicle control system which is an example of a mobile body control system to which the technology according to the present disclosure may be applied.

A vehicle control system 12000 is provided with a plurality of electronic control units connected to one another via a communication network 12001. In the example illustrated in FIG. 22, the vehicle control system 12000 is provided with a drive system control unit 12010, a body system control unit 12020, a vehicle exterior information detecting unit 12030, a vehicle interior information detecting unit 12040, and an integrated control unit 12050. Furthermore, a microcomputer 12051, an audio image output unit 12052, and an in-vehicle network interface (I/F) 12053 are illustrated as functional configurations of the integrated control unit 12050.

The drive system control unit 12010 controls operation of devices regarding a drive system of a vehicle according to various programs. For example, the drive system control unit 12010 serves as a control device of a driving force generating device for generating driving force of the vehicle such as an internal combustion engine and a driving motor, a driving force transmitting mechanism for transmitting the driving force to wheels, a steering mechanism for adjusting a rudder angle of the vehicle, a braking device for generating braking force of the vehicle and the like.

The body system control unit 12020 controls operation of various devices mounted on a vehicle body in accordance with the various programs. For example, the body system control unit 12020 serves as a control device of a keyless entry system, a smart key system, a power window device, or various types of lights such as a head light, a backing light, a brake light, a blinker, or a fog light. In this case, a radio wave transmitted from a portable device which substitutes for a key or signals of various switches may be input to the body system control unit 12020. The body system control unit 12020 receives an input of the radio wave or signals and controls a door lock device, the power window device, the lights and the like of the vehicle.

The vehicle exterior information detecting unit 12030 detects information outside the vehicle on which the vehicle control system 12000 is mounted. For example, an imaging unit 12031 is connected to the vehicle exterior information detecting unit 12030. The vehicle exterior information detecting unit 12030 allows the imaging unit 12031 to capture an image of the exterior of the vehicle and receives the captured image. The vehicle exterior information detecting unit 12030 may perform detection processing of objects such as a person, a vehicle, an obstacle, a sign, and a character on a road surface or distance detection processing on the basis of the received image.

The imaging unit 12031 is an optical sensor which receives light and outputs an electric signal corresponding to an amount of the received light. The imaging unit 12031 may output the electric signal as the image or output the same as ranging information. Furthermore, the light received by the imaging unit 12031 may be visible light or invisible light such as infrared light.

The vehicle interior information detecting unit 12040 detects information in the vehicle. The vehicle interior information detecting unit 12040 is connected to, for example, a driver state detecting unit 12041 for detecting a state of a driver. The driver state detecting unit 12041 includes, for example, a camera that images the driver, and the vehicle interior information detecting unit 12040 may calculate a driver's fatigue level or concentration level or may determine whether the driver is not dozing on the basis of detection information input from the driver state detecting unit 12041.

The microcomputer 12051 may calculate a control target value of the driving force generating device, the steering mechanism, or the braking device on the basis of the information inside and outside the vehicle obtained by the vehicle exterior information detecting unit 12030 or the vehicle interior information detecting unit 12040, and output a control instruction to the drive system control unit 12010. For example, the microcomputer 12051 may perform cooperative control for realizing functions of advanced driver assistance system (ADAS) including collision avoidance or impact attenuation of the vehicle, following travel based on the distance between the vehicles, vehicle speed maintaining travel, vehicle collision warning, vehicle lane departure warning and the like.

Furthermore, the microcomputer 12051 may perform the cooperative control for realizing automatic driving and the like to autonomously travel independent from the operation of the driver by controlling the driving force generating device, the steering mechanism, the braking device and the like on the basis of the information around the vehicle obtained by the vehicle exterior information detecting unit 12030 or the vehicle interior information detecting unit 12040.

Furthermore, the microcomputer 12051 may output the control instruction to the body system control unit 12020 on the basis of the information outside the vehicle obtained by the vehicle exterior information detecting unit 12030. For example, the microcomputer 12051 may perform the cooperative control to realize glare protection such as controlling the head light according to a position of a preceding vehicle or an oncoming vehicle detected by the vehicle exterior information detecting unit 12030 to switch a high beam to a low beam.

The audio image output unit 12052 transmits at least one of audio or image output signal to an output device capable of visually or audibly notifying an occupant of the vehicle or the outside the vehicle of the information. In the example in FIG. 22, as the output device, an audio speaker 12061, a display unit 12062, and an instrument panel 12063 are illustrated. The display unit 12062 may include at least one of an on-board display or a head-up display, for example.

Figure 23:
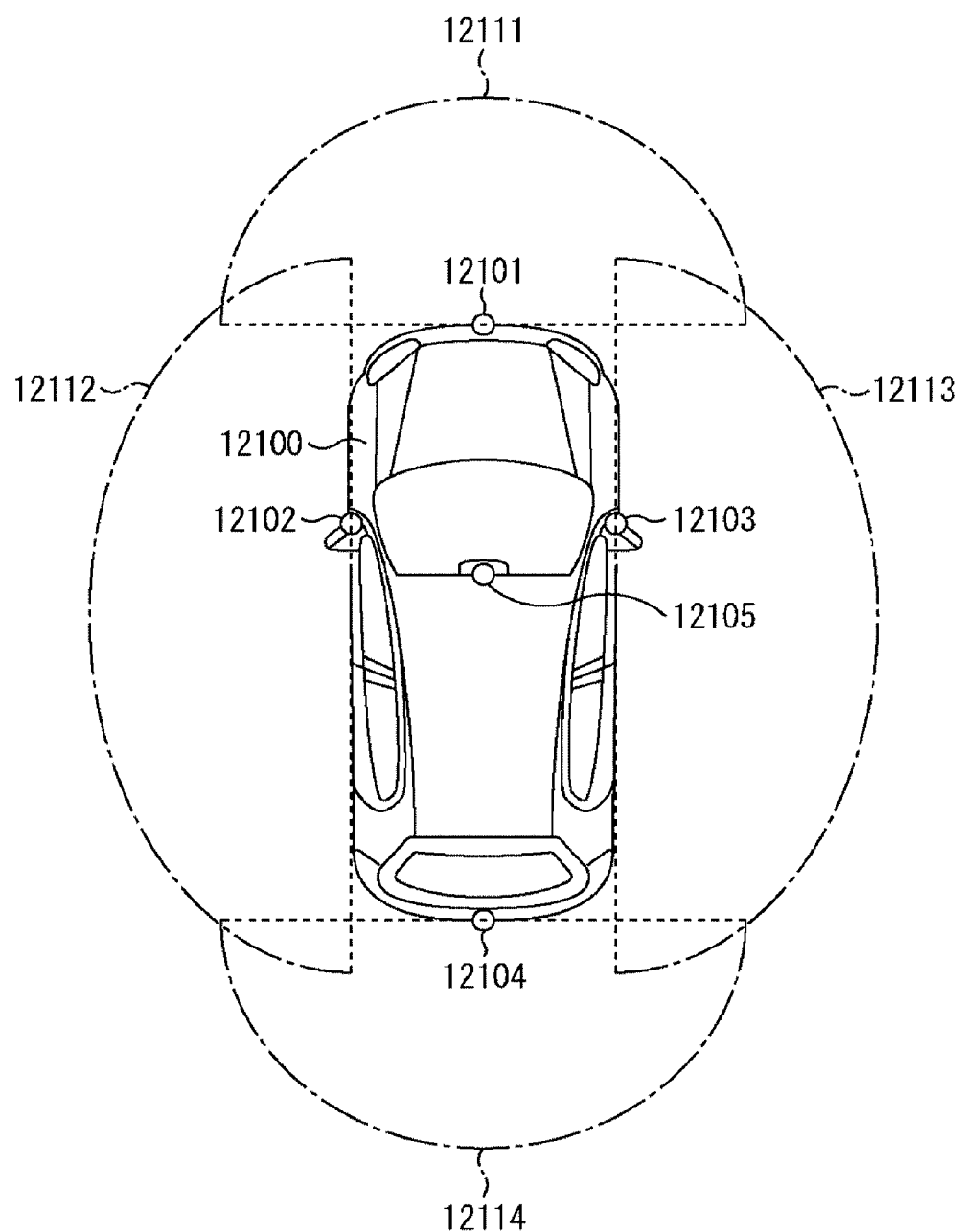
FIG. 23 is an explanatory view illustrating an example of an installation position of an imaging unit.

FIG. 23 is a view illustrating an example of an installation position of the imaging unit 12031.

In FIG. 23, imaging units 12101, 12102, 12103, 12104, and 12105 are included as the imaging unit 12031.

The imaging units 12101, 12102, 12103, 12104, and 12105 are provided in positions such as, for example, a front nose, a side mirror, a rear bumper, a rear door, and an upper portion of a front windshield in a vehicle interior of the vehicle 12100. The imaging unit 12101 provided on the front nose and the imaging unit 12105 provided in the upper portion of the front windshield in the vehicle interior principally obtain images in front of the vehicle 12100. The imaging units 12102 and 12103 provided on the side mirrors principally obtain images of the sides of the vehicle 12100. The imaging unit 12104 provided on the rear bumper or the rear door principally obtains an image behind the vehicle 12100. The imaging unit 12105 provided on the upper portion of the front windshield in the vehicle interior is mainly used for detecting the preceding vehicle, a pedestrian, an obstacle, a traffic signal, a traffic sign, a lane and the like.

Note that, in FIG. 23, an example of imaging ranges of the imaging units 12101 to 12104 is illustrated. An imaging range 12111 indicates the imaging range of the imaging unit 12101 provided on the front nose, imaging ranges 12112 and 12113 indicate the imaging ranges of the imaging units 12102 and 12103 provided on the side mirrors, and an imaging range 12114 indicates the imaging range of the imaging unit 12104 provided on the rear bumper or the rear door. For example, image data taken by the imaging units 12101 to 12104 are superimposed, so that an overlooking image of the vehicle 12100 as seen from above is obtained.

At least one of the imaging units 12101 to 12104 may have a function of obtaining distance information. For example, at least one of the imaging units 12101 to 12104 may be a stereo camera including a plurality of imaging elements, or may be an imaging element including pixels for phase difference detection.

For example, the microcomputer 12051 may extract especially a closest solid object on a traveling path of the vehicle 12100, the solid object traveling at a predetermined speed (for example, 0 km/h or higher) in a direction substantially the same as that of the vehicle 12100 as the preceding vehicle by obtaining a distance to each solid object in the imaging ranges 12111 to 12114 and change in time of the distance (relative speed relative to the vehicle 12100) on the basis of the distance information obtained from the imaging units 12101 to 12104. Moreover, the microcomputer 12051 may set the distance between the vehicles to be secured in advance from the preceding vehicle, and may perform automatic brake control (including following stop control), automatic acceleration control (including following start control) and the like. In this manner, it is possible to perform the cooperative control for realizing the automatic driving and the like to autonomously travel independent from the operation of the driver.

For example, the microcomputer 12051 may extract solid object data regarding the solid object while sorting the same into a motorcycle, a standard vehicle, a large-sized vehicle, a pedestrian, and other solid objects such as a utility pole on the basis of the distance information obtained from the imaging units 12101 to 12104 and use for automatically avoiding obstacles. For example, the microcomputer 12051 discriminates the obstacles around the vehicle 12100 into an obstacle visible to a driver of the vehicle 12100 and an obstacle difficult to see. Then, the microcomputer 12051 determines a collision risk indicating a degree of risk of collision with each obstacle, and when the collision risk is equal to or higher than a set value and there is a possibility of collision, this may perform driving assistance for avoiding the collision by outputting an alarm to the driver via the audio speaker 12061 and the display unit 12062 or performing forced deceleration or avoidance steering via the drive system control unit 12010.

At least one of the imaging units 12101 to 12104 may be an infrared camera for detecting infrared rays. For example, the microcomputer 12051 may recognize a pedestrian by determining whether or not there is a pedestrian in the images taken by the imaging units 12101 to 12104. Such pedestrian recognition is carried out, for example, by a procedure of extracting feature points in the images taken by the imaging units 12101 to 12104 as the infrared cameras and a procedure of performing pattern matching processing on a series of feature points indicating an outline of an object to discriminate whether or not this is a pedestrian. When the microcomputer 12051 determines that there is a pedestrian in the images taken by the imaging units 12101 to 12104 and recognizes the pedestrian, the audio image output unit 12052 controls the display unit 12062 to superimpose a rectangular contour for emphasis on the recognized pedestrian. Furthermore, the audio image output unit 12052 may control the display unit 12062 to display an icon and the like indicating the pedestrian at a desired position.

An example of the vehicle control system to which the technology according to the present disclosure may be applied is described above. The technology according to the present disclosure may be applied to the imaging unit 12031, for example, out of the configurations described above. Specifically, the solid-state imaging element 200 in FIG. 2 may be applied to the imaging unit 12031. By applying the technology according to the present disclosure to the imaging unit 12031, the reliability of the ADC 305 in the solid-state imaging element 200 may be improved, so that it becomes possible to improve the reliability of the vehicle control system.

Note that, the above-described embodiments describe an example of embodying the present technology, and there is a correspondence relationship between matters in the embodiments and the matters specifying the invention in claims. Similarly, there is a correspondence relationship between the matters specifying the invention in claims and the matters in the embodiments of the present technology assigned with the same names. However, the present technology is not limited to the embodiments and may be embodied with various modifications of the embodiment without departing from the spirit thereof.

Furthermore, the procedures described in the above-described embodiments may be considered as a method including a series of procedures and may be considered as a program for allowing a computer to execute the series of procedures and a recording medium which stores the program. A compact disc (CD), a MiniDisc (MD), a digital versatile disc (DVD), a memory card, a Blu-Ray™ Disc and the like may be used, for example, as the recording medium.

Note that, the effect described in this specification is illustrative only and is not limitative; there may also be another effect.

Note that, the present technology may also have a following configuration.

(1) An analog to digital converter including:

a differential amplifier circuit configured to amplify a difference between an input analog signal and a ramp signal which changes over time to output as a difference signal;

an amplifying element configured to amplify the difference signal to output as an amplified signal;

a time measuring unit configured to measure a length of a conversion period until a level of the analog signal substantially coincides with a level of the ramp signal on the basis of a level of the amplified signal to output as a digital signal obtained by converting the analog signal;

a capacitor having one end connected to one of an input terminal or a predetermined connection terminal of the amplifying element; and a switch configured to connect the other end of the capacitor to the other of the input terminal or the predetermined connection terminal in the conversion period and disconnect the other end from the other in a period other than the conversion period.

(2) The analog to digital converter according to (1) described above, in which the predetermined connection terminal is an output terminal of the amplifying terminal.

(3) The analog to digital converter according to (1) described above, in which the predetermined connection terminal is a terminal of a power supply potential.

(4) The analog to digital converter according to (1) described above,
in which the predetermined connection terminal is a terminal of a predetermined reference potential lower than a power supply potential.

(5) The analog to digital converter according to any one of (1) to (4) described above,
in which the one end is connected to the input terminal, and
the switch connects the other end to the predetermined connection terminal in a case where the level of the amplified signal is the predetermined level.

(6) The analog to digital converter according to any one of (1) to (4) described above,
in which the one end is connected to the predetermined connection terminal, and
the switch connects the other end to the input terminal in a case where the level of the amplified signal is the predetermined level.

(7) The analog to digital converter according to any one of (1) to (5) described above,
in which the capacitor is a MOS capacitor.

(8) The analog to digital converter according to any one of (1) to (7) described above,
in which the differential amplifier circuit includes a pair of N-type MOS transistors which output a signal corresponding to the difference.

(9) The analog to digital converter according to any one of (1) to (7) described above,
in which the differential amplifier circuit includes a pair of P-type MOS transistors which output a signal corresponding to the difference.

(10) A solid-state imaging element including:
an analog to digital converter including a differential amplifier circuit configured to amplify a difference between an input analog signal and a ramp signal which changes over time to output as a difference signal, an amplifying element configured to amplify the difference signal to output as an amplified signal, a time measuring unit configured to measure a length of a conversion period until a level of the analog signal substantially coincides with a level of the ramp signal on the basis of a level of the amplified signal to output as a digital signal obtained by converting the analog signal, a capacitor having one end connected to one of an input terminal or a predetermined connection terminal of the amplifying element, and a switch configured to connect the other end of the capacitor to the other of the input terminal or the predetermined connection terminal in the conversion period and disconnect the other end from the other in a period other than the conversion period; and
a pixel array unit in which pixels configured to generate the analog signal to input to the analog to digital converter are arranged.

(11) The solid-state imaging element according to (10) described above,
in which the pixel array unit is arranged on a first semiconductor chip, and
the analog to digital converter is arranged on a second semiconductor chip layered on the first substrate.

(12) A control method of an analog to digital converter, including:
a differential amplifying step of amplifying a difference between an input analog signal and a ramp signal which changes over time to output as a difference signal;
a time measuring step of measuring a length of a conversion period until a level of the analog signal substantially coincides with a level of the ramp signal on the basis of a level of an amplified signal from an amplifying element configured to amplify the difference signal to output as the amplified signal to output as a digital signal obtained by converting the analog signal; and
a switching step of connecting the other end of a capacitor having one end connected to one of an input terminal or a predetermined connection terminal of the amplifying element to the other of the input terminal or the predetermined connection terminal in the conversion period and disconnecting the other end from the other in a period other than the conversion period.

REFERENCE SIGNS LIST

100 Imaging device
110 Optical unit
120 Digital signal processor
130 Display unit
140 Operating unit
150 Bus
160 Frame memory
170 Storage unit
180 Power supply unit
200 Solid-state imaging element
201 Upper semiconductor chip
202, 203, 204 TSV arranging area
205 Lower semiconductor chip
210 Row selecting circuit
220 Pixel array unit
230 Pixel
231 Photodiode
232 Transfer transistor
233 Reset transistor
234 Floating diffusion layer
235 Amplification transistor
236 Selection transistor
240 Timing control circuit
250 DAC
260 Horizontal transfer scanning circuit
300 Column signal processing unit
305 ADC
310 Comparator
320, 380 Differential amplifier circuit
321, 322, 331, 332, 336, 381, 383, 384 pMOS transistor
323, 324, 326, 327, 329, 334, 351, 353, 386 to 389 nMOS transistor
325, 328, 333, 352, 382, 385 Capacitor
330 Amplifier circuit
335 Switch
340 Feedback circuit
341 Inverter
342 Negative AND (NAND) gate
350 Offset compensating circuit
360 Counter
370 Latch circuit
12031 Imaging unit

The invention claimed is:
1. An analog to digital converter comprising:
a differential amplifier circuit configured to amplify a difference between an input analog signal and a ramp signal which changes over time to output as a difference signal;
an amplifying element configured to amplify the difference signal to output as an amplified signal;
a time measuring unit configured to measure a length of a conversion period until a level of the analog signal substantially coincides with a level of the ramp signal on a basis of a level of the amplified signal to output as a digital signal obtained by converting the analog signal;

a capacitor having one end connected to one of an input terminal or a predetermined connection terminal of the amplifying element; and a switch configured to connect another end of the capacitor to another of the input terminal or the predetermined connection terminal in the conversion period and disconnect the another end from the another in a period other than the conversion period.

2. The analog to digital converter according to claim 1, wherein the predetermined connection terminal is an output terminal of the amplifying terminal.

3. The analog to digital converter according to claim 1, wherein the predetermined connection terminal is a terminal of a power supply potential.

4. The analog to digital converter according to claim 1, wherein the predetermined connection terminal is a terminal of a predetermined reference potential lower than a power supply potential.

5. The analog to digital converter according to claim 1, wherein the one end is connected to the input terminal, and
the switch connects the another end to the predetermined connection terminal in a case where the level of the amplified signal is the predetermined level.

6. The analog to digital converter according to claim 1, wherein the one end is connected to the predetermined connection terminal, and
the switch connects the another end to the input terminal in a case where the level of the amplified signal is the predetermined level.

7. The analog to digital converter according to claim 1, wherein the capacitor is a MOS capacitor.

8. The analog to digital converter according to claim 1, wherein the differential amplifier circuit includes a pair of N-type MOS transistors which output a signal corresponding to the difference.

9. The analog to digital converter according to claim 1, wherein the differential amplifier circuit includes a pair of P-type MOS transistors which output a signal corresponding to the difference.

10. A solid-state imaging element comprising:
an analog to digital converter including a differential amplifier circuit configured to amplify a difference between an input analog signal and a ramp signal which changes over time to output as a difference signal, an amplifying element configured to amplify the difference signal to output as an amplified signal, a time measuring unit configured to measure a length of a conversion period until a level of the analog signal substantially coincides with a level of the ramp signal on a basis of a level of the amplified signal to output as a digital signal obtained by converting the analog signal, a capacitor having one end connected to one of an input terminal or a predetermined connection terminal of the amplifying element, and a switch configured to connect another end of the capacitor to another of the input terminal or the predetermined connection terminal in the conversion period and disconnect the another end from the another in a period other than the conversion period; and a pixel array unit in which pixels configured to generate the analog signal to input to the analog to digital converter are arranged.

11. The solid-state imaging element according to claim 10,
wherein the pixel array unit is arranged on a first semiconductor chip, and
the analog to digital converter is arranged on a second semiconductor chip layered on the first substrate.

12. A control method of an analog to digital converter, comprising:
a differential amplifying step of amplifying a difference between an input analog signal and a ramp signal which changes over time to output as a difference signal;
a time measuring step of measuring a length of a conversion period until a level of the analog signal substantially coincides with a level of the ramp signal on a basis of a level of an amplified signal from an amplifying element configured to amplify the difference signal to output as the amplified signal to output as a digital signal obtained by converting the analog signal; and
a switching step of connecting another end of a capacitor having one end connected to one of an input terminal or a predetermined connection terminal of the amplifying element to another of the input terminal or the predetermined connection terminal in the conversion period and disconnecting the another end from the another in a period other than the conversion period.

13. The solid-state imaging element according to claim 10,
wherein the predetermined connection terminal is an output terminal of the amplifying terminal.

14. The solid-state imaging element according to claim 10,
wherein the predetermined connection terminal is a terminal of a power supply potential.

15. The solid-state imaging element according to claim 10,
wherein the predetermined connection terminal is a terminal of a predetermined reference potential lower than a power supply potential.

16. The solid-state imaging element according to claim 10,
wherein the one end is connected to the input terminal, and
the switch connects the another end to the predetermined connection terminal in a case where the level of the amplified signal is the predetermined level.

17. The solid-state imaging element according to claim 10,
wherein the one end is connected to the predetermined connection terminal, and
the switch connects the another end to the input terminal in a case where the level of the amplified signal is the predetermined level.

18. The solid-state imaging element according to claim 10,
wherein the capacitor is a MOS capacitor.

19. The solid-state imaging element according to claim 10,
wherein the differential amplifier circuit includes a pair of N-type MOS transistors which output a signal corresponding to the difference.

20. The solid-state imaging element according to claim 10,
wherein the differential amplifier circuit includes a pair of P-type MOS transistors which output a signal corresponding to the difference.

* * * * *